US012642069B2

(12) United States Patent
Morrow et al.

(10) Patent No.: US 12,642,069 B2
(45) Date of Patent: May 26, 2026

(54) TRANSISTOR CELLS INCLUDING A DEEP VIA LINED WITH A DIELECTRIC MATERIAL

(71) Applicant: Intel Corporation, Santa Clara, CA (US)

(72) Inventors: Patrick Morrow, Portland, OR (US); Mauro J. Kobrinsky, Portland, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 700 days.

(21) Appl. No.: 17/731,149

(22) Filed: Apr. 27, 2022

(65) Prior Publication Data

US 2022/0254681 A1     Aug. 11, 2022

Related U.S. Application Data

(62) Division of application No. 16/082,263, filed as application No. PCT/US2016/025593 on Apr. 1, 2016, now Pat. No. 11,328,951.

(51) Int. Cl.
H01L 21/768 (2006.01)
H01L 23/535 (2006.01)
(Continued)

(52) U.S. Cl.
CPC ........ H10W 20/076 (2026.01); H10D 30/024 (2025.01); H10D 30/60 (2025.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

| 5,355,022 A | 10/1994 | Sugahara et al. |
| 5,869,867 A | 2/1999 | Takeuchi |

(Continued)

FOREIGN PATENT DOCUMENTS

| CN | 1309077 C | 4/2007 |
| CN | 105448998 | 3/2016 |

(Continued)

OTHER PUBLICATIONS

Extended European Search Report mailed Oct. 15, 2019, for European Patent Application No. 16897382.4.
(Continued)

*Primary Examiner* — Wael M Fahmy
*Assistant Examiner* — Quinton A Brasfield
(74) *Attorney, Agent, or Firm* — Essential Patents Group, LLP

(57) ABSTRACT

A transistor cell including a deep via that is at least partially lined with a dielectric material. The deep via may extend down to a substrate over which the transistor is disposed. The deep via may be directly connected to a terminal of the transistor, such as the source or drain, to interconnect the transistor with an interconnect metallization level disposed in the substrate under the transistor, or on at opposite side of the substrate as the transistor. Parasitic capacitance associated with the close proximity of the deep via metallization to one or more terminals of the transistor may be reduced by lining at least a portion of the deep via sidewall with dielectric material, partially necking the deep via metallization in a region adjacent to the transistor.

19 Claims, 22 Drawing Sheets

(51) Int. Cl.

| | |
|---|---|
| *H10D 30/01* | (2025.01) |
| *H10D 30/60* | (2025.01) |
| *H10D 30/62* | (2025.01) |
| *H10D 30/66* | (2025.01) |
| *H10D 84/01* | (2025.01) |
| *H10D 84/03* | (2025.01) |
| *H10D 84/83* | (2025.01) |
| *H10W 20/00* | (2026.01) |
| *H10W 20/20* | (2026.01) |

(52) U.S. Cl.

CPC ......... *H10D 30/62* (2025.01); *H10D 30/6211* (2025.01); *H10D 84/0158* (2025.01); *H10D 84/038* (2025.01); *H10D 84/834* (2025.01); *H10W 20/069* (2026.01); *H10W 20/0698* (2026.01); *H10W 20/083* (2026.01); *H10W 20/20* (2026.01); *H10D 30/663* (2025.01); *H10D 84/0147* (2025.01); *H10D 84/0149* (2025.01); *H10W 20/023* (2026.01)

(58) Field of Classification Search

CPC ........... H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 27/10826; H01L 27/10879; H01L 21/823418; H01L 21/823814; H01L 21/823425; H01L 29/0847; H01L 29/7848; H01L 29/66636; H01L 29/41783; H01L 29/66575; H01L 29/161; H01L 29/167; H01L 29/41725; H01L 29/41733; H01L 29/4175; H01L 29/41766; H01L 29/41775; H01L 21/823475; H01L 21/823871; H01L 21/76895; H01L 21/76897; H01L 21/743; H01L 21/76804; H01L 21/76805; H01L 23/5226; H01L 23/5283; H01L 23/5286; H01L 23/528; H01L 23/481; H01L 23/535; H01L 23/5384; H01L 23/5386; H01L 23/49827; H01L 2225/06541–06544; H01L 2225/06548; H01L 21/76898; H01L 21/486; H10B 12/36; H10B 12/056

See application file for complete search history.

(56) References Cited

U.S. PATENT DOCUMENTS

| | | | |
|---|---|---|---|
| 6,424,020 B1 | 7/2002 | Vu et al. | |
| 6,455,398 B1 | 9/2002 | Fonstad et al. | |
| 6,605,951 B1 | 8/2003 | Cowan | |
| 6,627,953 B1 | 9/2003 | Vu et al. | |
| 7,091,534 B2 | 8/2006 | Koyanagi | |
| 7,402,866 B2 | 7/2008 | Liang et al. | |
| 7,825,472 B2 | 11/2010 | Park et al. | |
| 8,018,008 B2 | 9/2011 | Ozoe | |
| 8,084,795 B2 | 12/2011 | Pan | |
| 8,354,675 B2 | 1/2013 | Kwon et al. | |
| 8,395,191 B2 | 3/2013 | Or-Bach et al. | |
| 8,426,888 B2 | 4/2013 | Molin | |
| 9,129,926 B2 | 9/2015 | Koo et al. | |
| 9,171,887 B2 | 10/2015 | Yokoyama | |
| 9,184,136 B2 | 11/2015 | Kim et al. | |
| 9,305,834 B1 | 4/2016 | Latypov et al. | |
| 9,385,195 B1 | 7/2016 | Zhang | |
| 9,412,788 B2 | 8/2016 | Yokoyama et al. | |
| 9,450,075 B2 | 9/2016 | Huang | |
| 9,640,531 B1 * | 5/2017 | Or-Bach ............... H10D 88/00 | |
| 9,818,856 B2 | 11/2017 | Hoshi et al. | |
| 9,929,133 B2 | 3/2018 | Lin et al. | |
| 10,420,171 B2 | 9/2019 | Goktepeli | |
| 2001/0041407 A1 | 11/2001 | Brown | |
| 2004/0119165 A1 | 6/2004 | Baukus et al. | |
| 2005/0151276 A1 | 7/2005 | Jang et al. | |
| 2005/0186787 A1 * | 8/2005 | Jung ................ H01L 21/76831 | |
| | | | 438/653 |
| 2006/0115943 A1 | 6/2006 | Koyanagi | |
| 2007/0001219 A1 | 1/2007 | Radosavljevic et al. | |
| 2007/0296002 A1 | 12/2007 | Liang et al. | |
| 2008/0179678 A1 * | 7/2008 | Dyer .................. H10D 88/101 | |
| | | | 438/154 |
| 2009/0152611 A1 | 6/2009 | Fujimoto | |
| 2009/0166677 A1 | 7/2009 | Shibata et al. | |
| 2011/0241073 A1 | 10/2011 | Cohen et al. | |
| 2012/0043663 A1 | 2/2012 | Ko et al. | |
| 2012/0088339 A1 | 4/2012 | Molin et al. | |
| 2013/0126981 A1 | 5/2013 | Ho et al. | |
| 2013/0130479 A1 | 5/2013 | Stuber et al. | |
| 2013/0134585 A1 | 5/2013 | Stuber et al. | |
| 2013/0162346 A1 | 6/2013 | McElvain et al. | |
| 2014/0054685 A1 | 2/2014 | Consentino et al. | |
| 2014/0210058 A1 | 7/2014 | Lee et al. | |
| 2014/0231874 A1 | 8/2014 | Hoshi et al. | |
| 2014/0264632 A1 | 9/2014 | Richter et al. | |
| 2014/0332749 A1 | 11/2014 | Yokoyama | |
| 2015/0028289 A1 | 1/2015 | Hekmatshoartabari | |
| 2015/0061020 A1 * | 3/2015 | Yokoyama ............. H10B 61/22 | |
| | | | 438/666 |
| 2015/0061026 A1 | 3/2015 | Lin et al. | |
| 2015/0069520 A1 * | 3/2015 | Lee ...................... H10D 84/038 | |
| | | | 257/371 |
| 2015/0137224 A1 | 5/2015 | Meiser et al. | |
| 2015/0137842 A1 | 5/2015 | Murakami et al. | |
| 2015/0206936 A1 | 7/2015 | Huang | |
| 2015/0235949 A1 | 8/2015 | Yu et al. | |
| 2015/0280010 A1 | 10/2015 | Shieh et al. | |
| 2015/0318381 A1 | 11/2015 | Tsai et al. | |
| 2015/0347659 A1 | 12/2015 | Chiang et al. | |
| 2015/0357425 A1 | 12/2015 | Liu et al. | |
| 2015/0380305 A1 | 12/2015 | Basker et al. | |
| 2016/0043083 A1 | 2/2016 | Kawa et al. | |
| 2016/0093629 A1 | 3/2016 | Wang | |
| 2016/0095221 A1 | 3/2016 | Ramachandran et al. | |
| 2016/0197069 A1 | 7/2016 | Morrow et al. | |
| 2016/0247887 A1 | 8/2016 | Jun et al. | |
| 2016/0307996 A1 | 10/2016 | Meiser et al. | |
| 2016/0351492 A1 | 12/2016 | Watanabe et al. | |
| 2018/0197895 A1 | 7/2018 | Liu | |
| 2019/0057959 A1 | 2/2019 | Or-Bach et al. | |
| 2019/0259699 A1 | 8/2019 | Morrow et al. | |
| 2020/0373301 A1 | 11/2020 | Kim et al. | |
| 2021/0336012 A1 | 10/2021 | Huang et al. | |
| 2021/0391325 A1 | 12/2021 | Su et al. | |

FOREIGN PATENT DOCUMENTS

| | | |
|---|---|---|
| EP | 1624487 | 2/2006 |
| EP | 1638142 | 3/2006 |
| JP | H05198739 | 8/1993 |
| JP | H09260669 | 3/1997 |
| JP | 2002538465 | 11/2002 |
| JP | 2008529012 | 7/2008 |
| JP | 2009135350 A | 6/2009 |
| JP | 2009295961 | 12/2009 |
| JP | 2010171166 A | 8/2010 |
| JP | 2012088065 | 5/2012 |
| JP | 2012195539 | 10/2012 |
| JP | 2013120887 | 6/2013 |
| JP | 2014220376 | 11/2014 |
| JP | 2014170940 | 3/2017 |
| KR | 1020100106702 | 10/2010 |
| TW | 200624818 | 7/2006 |
| WO | 2011058611 A1 | 5/2011 |
| WO | 2013004836 | 1/2013 |
| WO | 2013166116 | 11/2013 |
| WO | 2017052562 | 3/2017 |

(56)          References Cited

FOREIGN PATENT DOCUMENTS

| WO | 2017052626 | 3/2017 |
|----|------------|--------|
| WO | 2017095409 | 6/2017 |
| WO | 2018031175 | 2/2018 |
| WO | 2018063302 | 4/2018 |

OTHER PUBLICATIONS

Final Office Action from U.S. Appl. No. 16/082,263 notified Mar. 8, 2021, 14 pgs.
International Preliminary Report on Patentability mailed Oct. 11, 2018 for PCT Patent Application No. PCT/US16/25593.
International Search Report and Written Opinion for International Application No. PCT/US2016/025593, mailed Dec. 23, 2016.
Non-Final Office Action from U.S. Appl. No. 16/082,263 notified Aug. 5, 2020, 12 pgs.
Notice of Allowance from U.S. Appl. No. 16/082,263 notified Jan. 20, 2022, 11 pgs.
Office Action from Taiwan Patent Application No. 106105439 notified Dec. 25, 2021, 13 pgs.
Restriction Requirement from U.S. Appl. No. 16/082,263 notified May 5, 2020, 6 pgs.

\* cited by examiner

101

171    171    145

206

173

190

185    195    190

180    180

207    105

Z

X

C ⟷ C'

Q

101

171    145    171

206

173

150    150

140    140

$H_f$    103    180

105

Z

X

D ⟷ D'

501

Receive Substrate With Transistors
505

Pattern & Etch Deep Via Adjacent to Transistor
510

Form Dielectric Liner On Portion of
Deep Via Sidewalls
515

Form Source/Drain Metallization
520

Fill Lined Deep Via With Conductive Material
525

Complete Device Processing
530

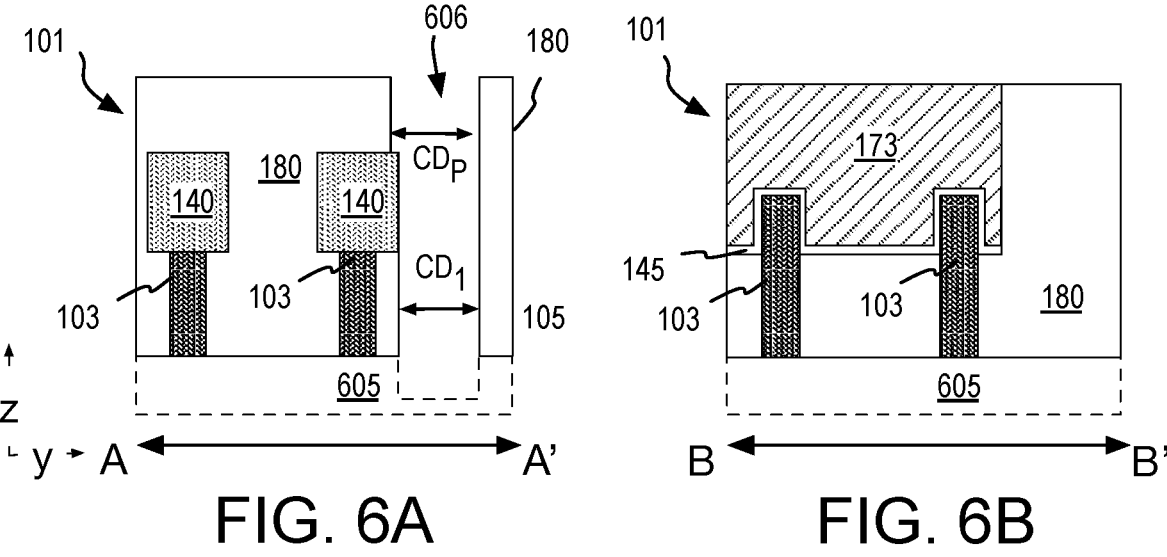
FIG. 6A
FIG. 6B
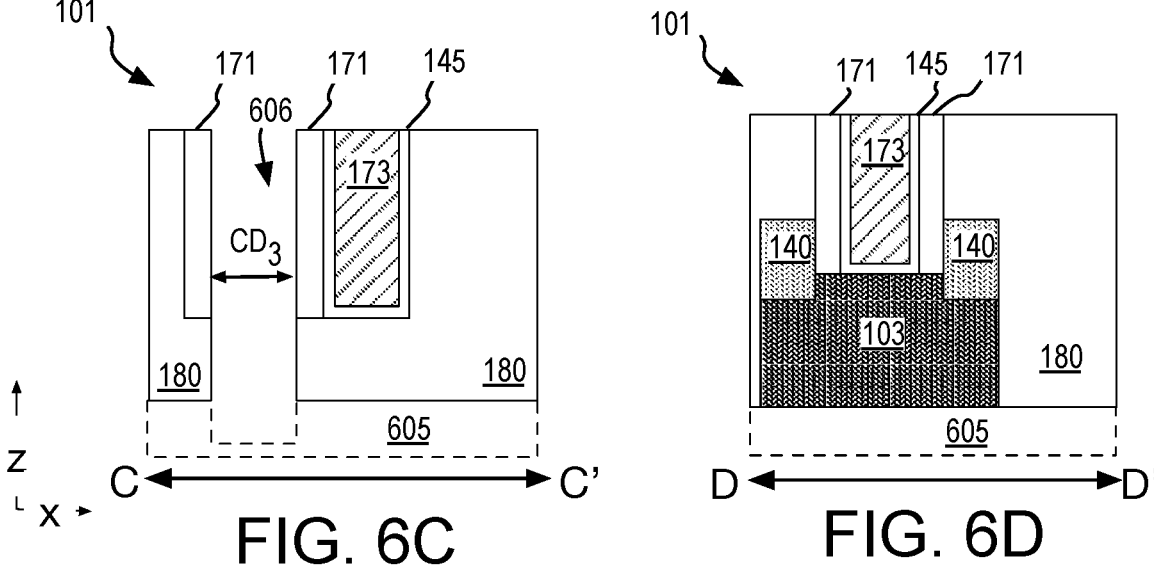
FIG. 6C
FIG. 6D

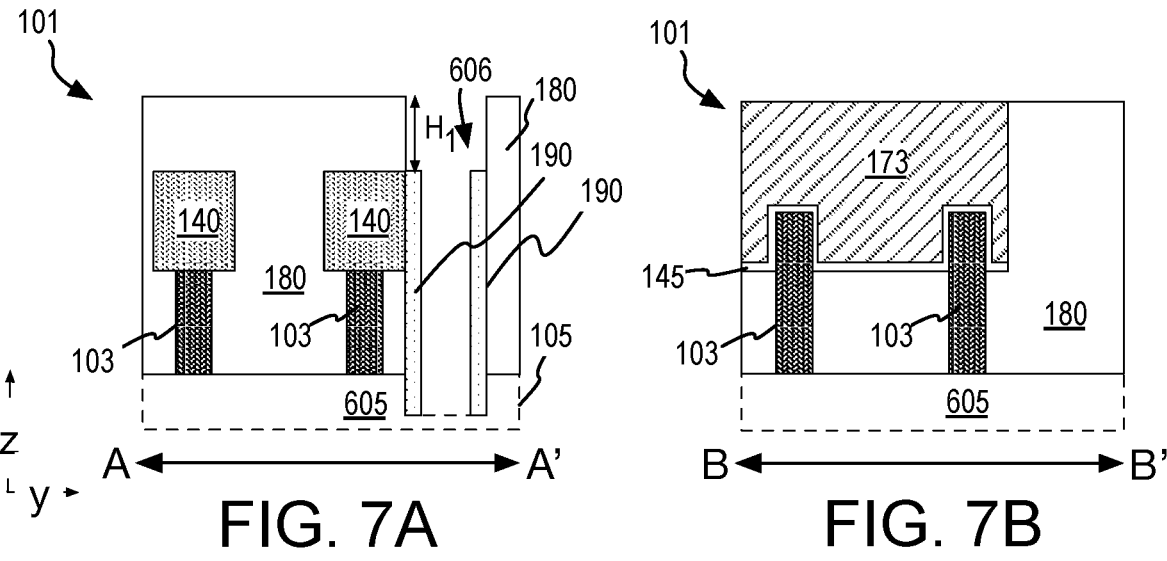
FIG. 7A
FIG. 7B
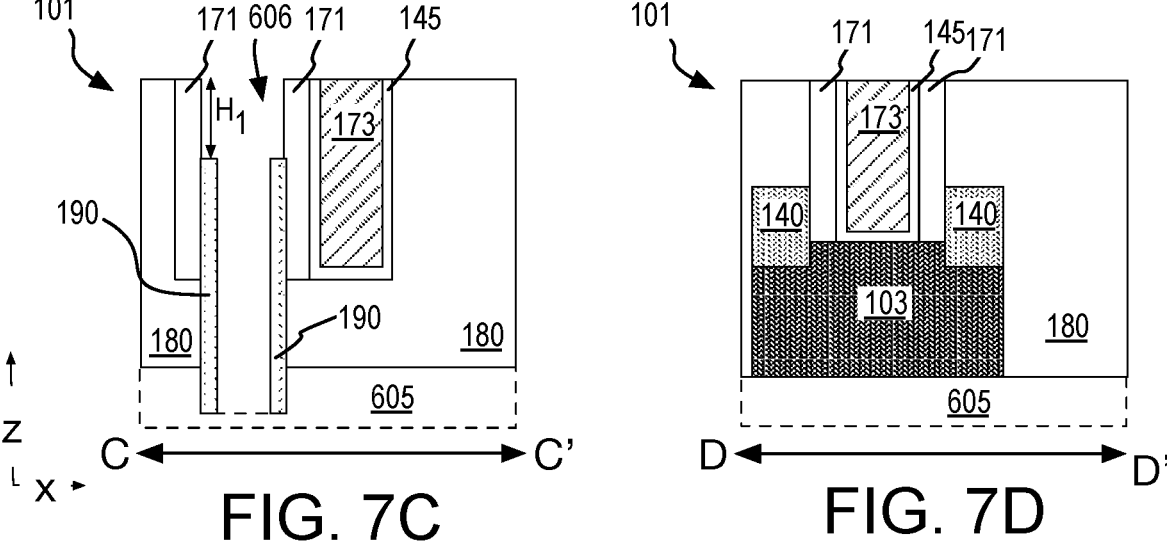
FIG. 7C
FIG. 7D

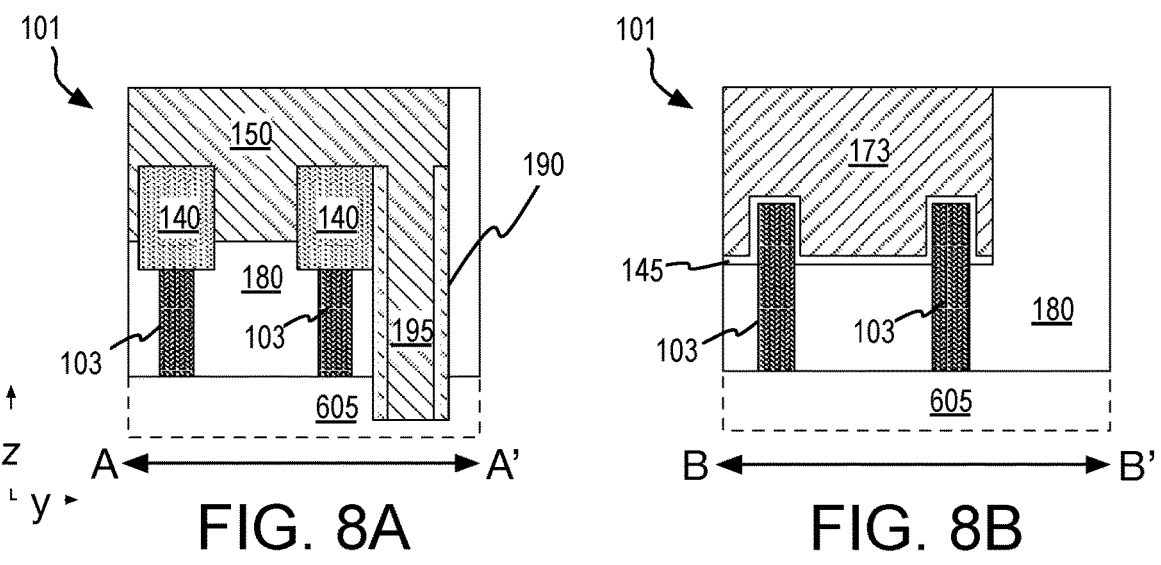
FIG. 8A
FIG. 8B
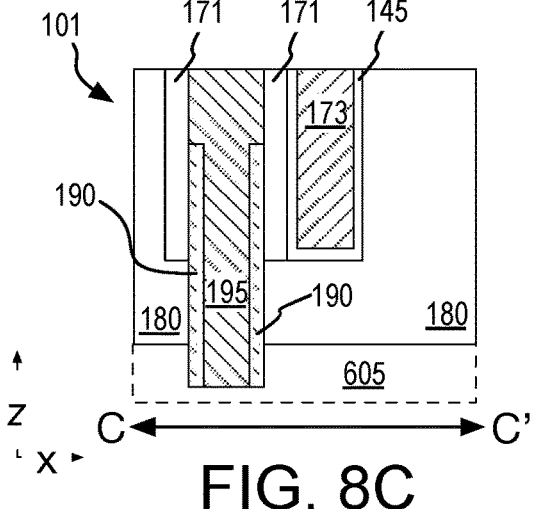
FIG. 8C
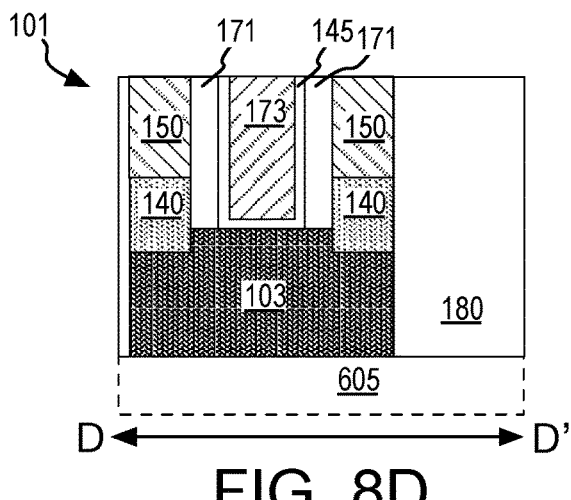
FIG. 8D

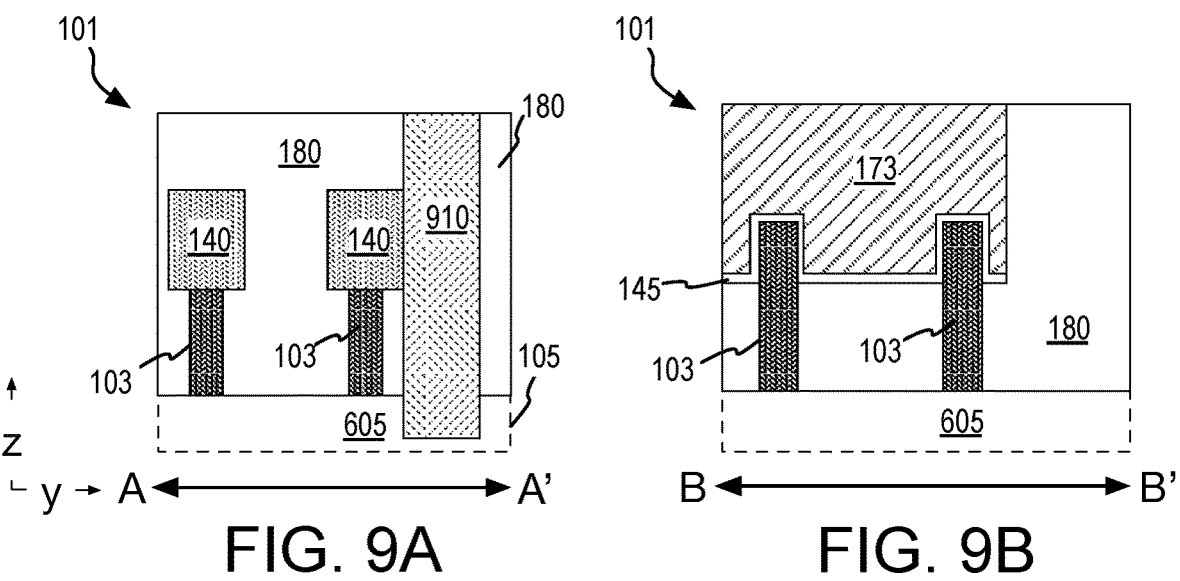
FIG. 9A
FIG. 9B
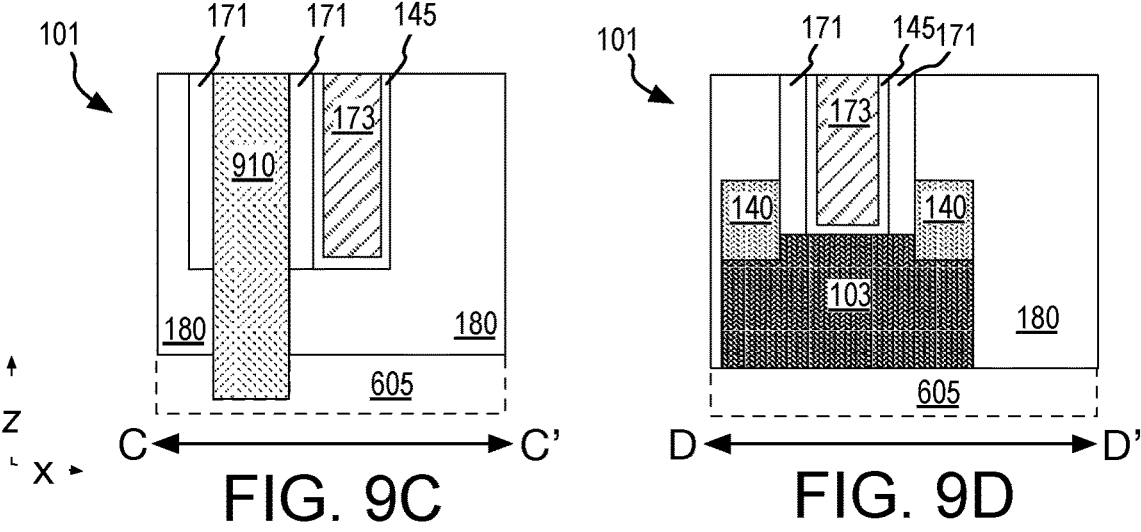
FIG. 9C
FIG. 9D

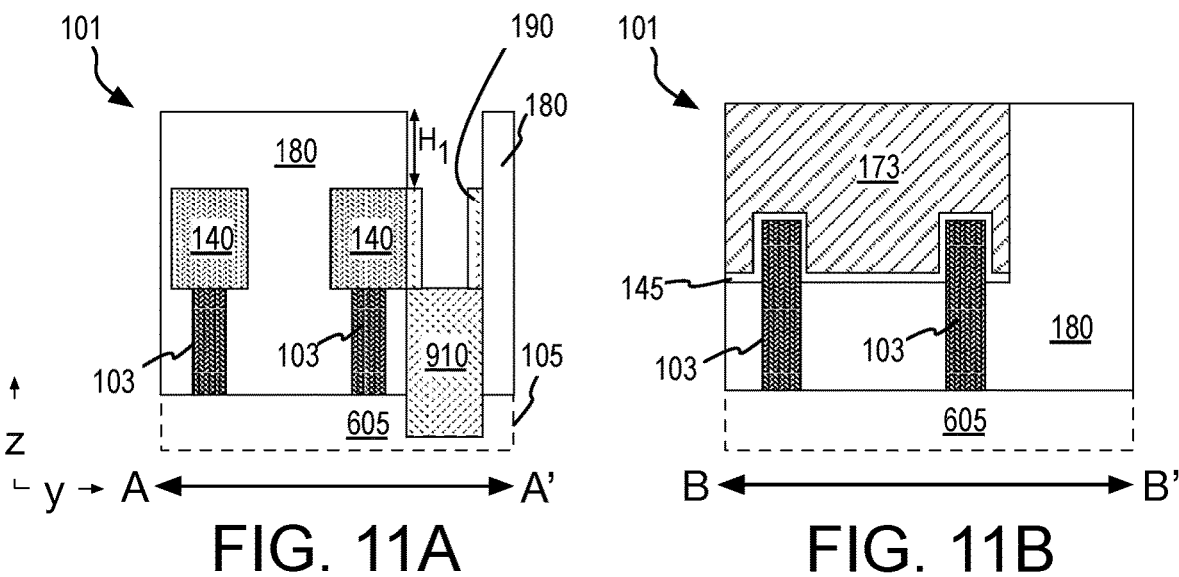
FIG. 11A
FIG. 11B
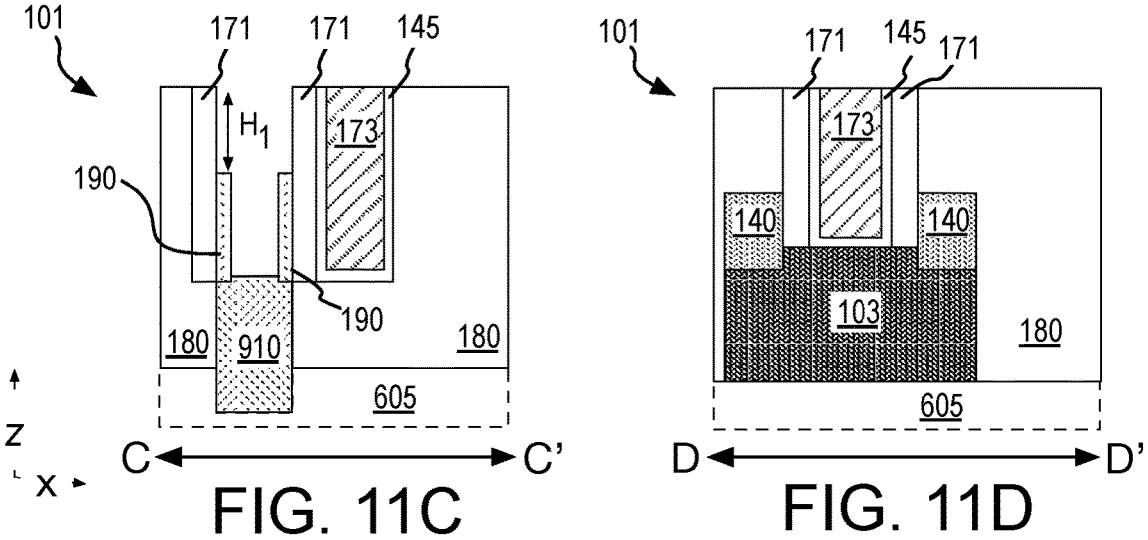
FIG. 11C
FIG. 11D

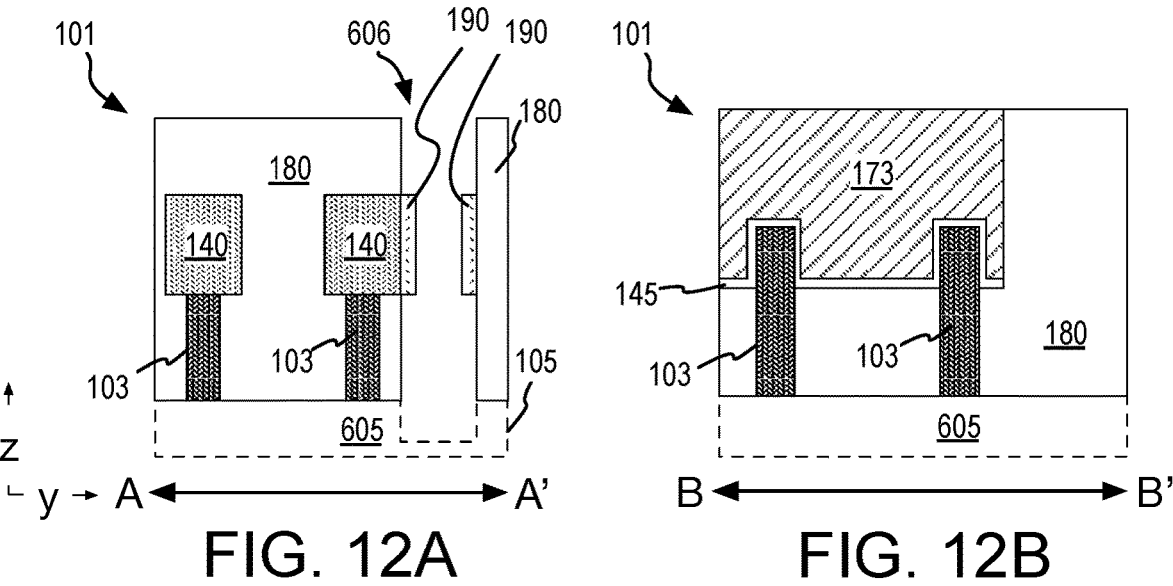
FIG. 12A
FIG. 12B
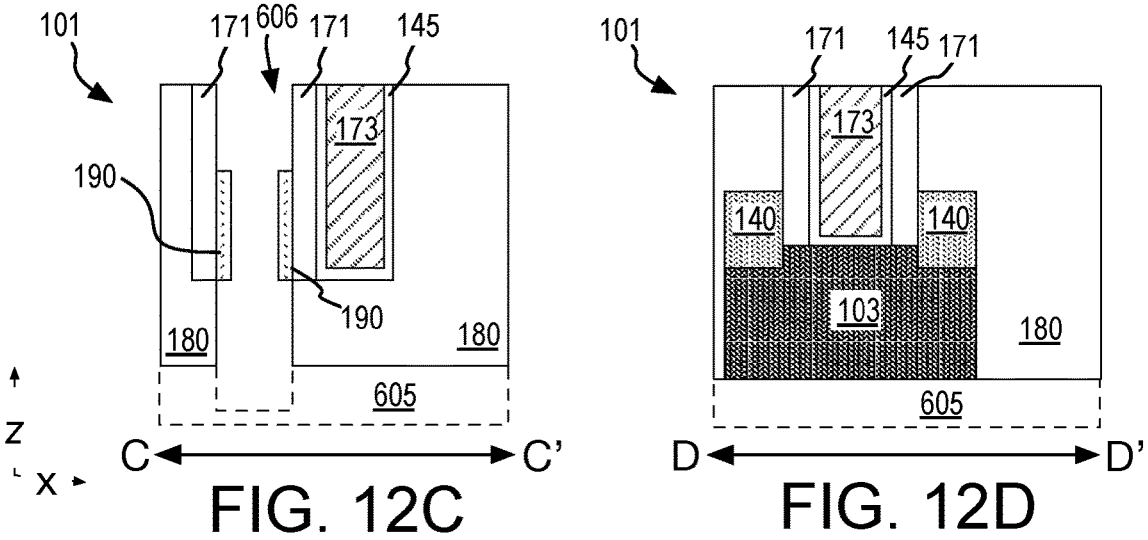
FIG. 12C
FIG. 12D

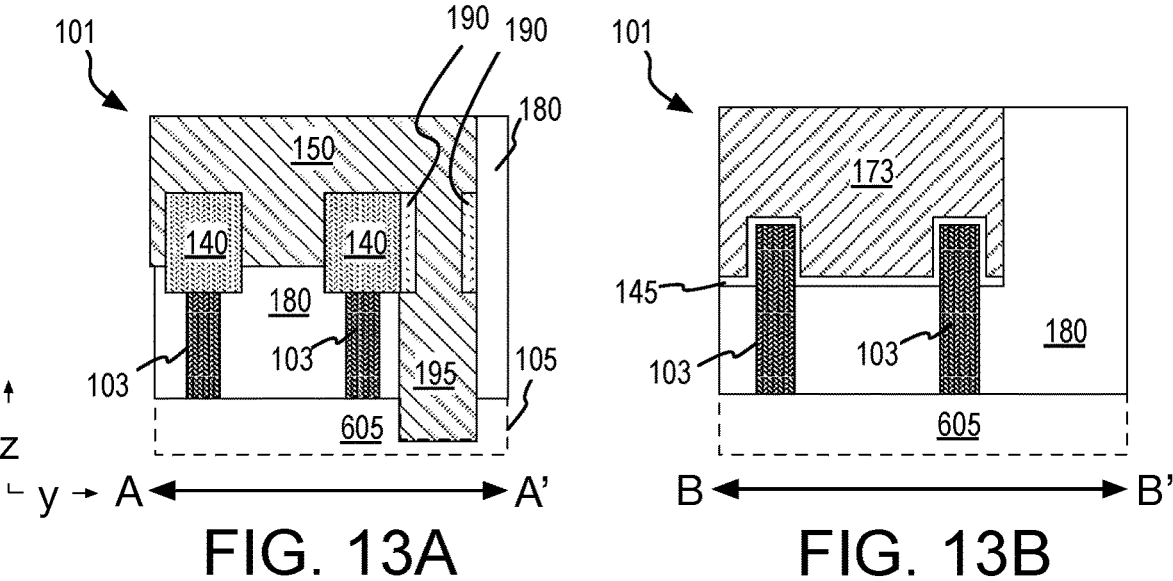
FIG. 13A
FIG. 13B
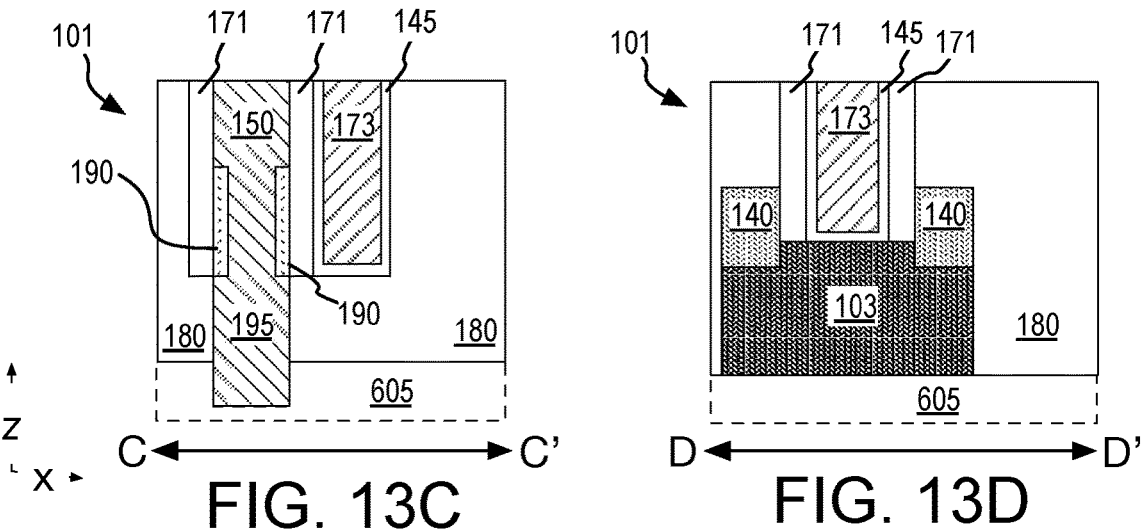
FIG. 13C
FIG. 13D

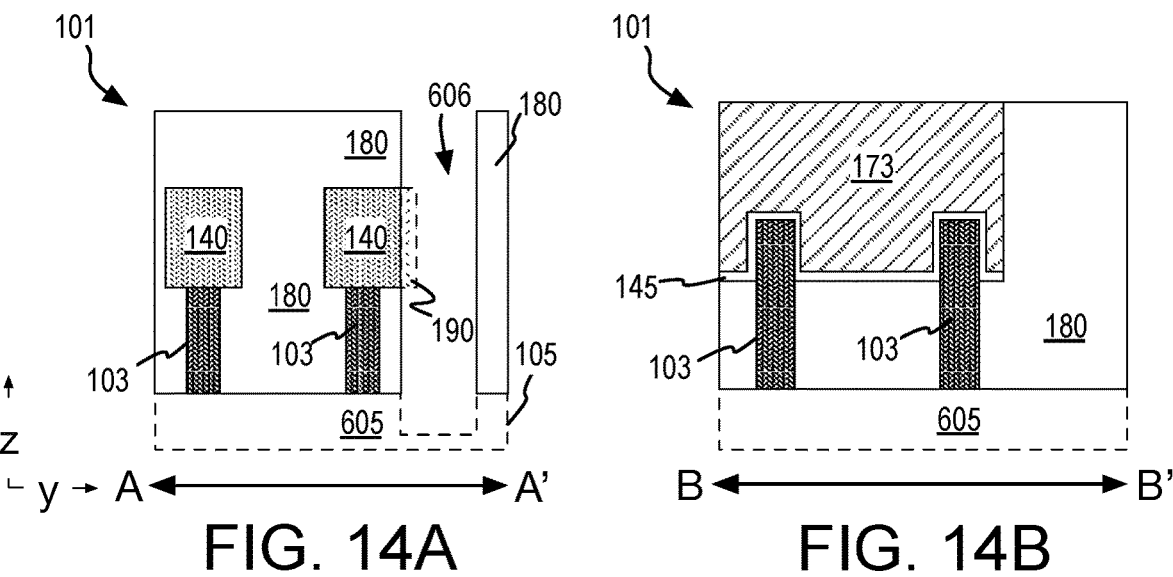
FIG. 14A
FIG. 14B
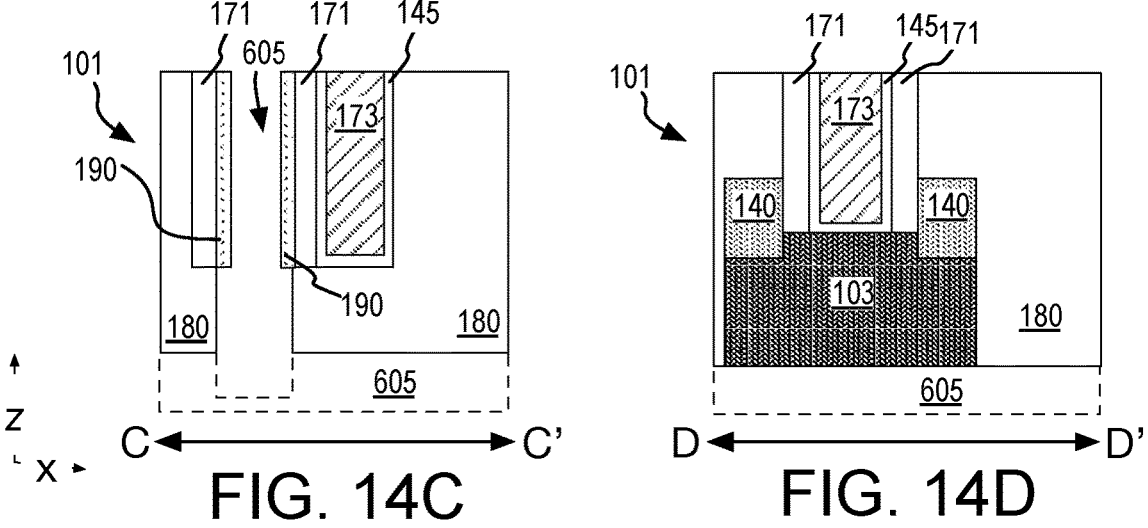
FIG. 14C
FIG. 14D

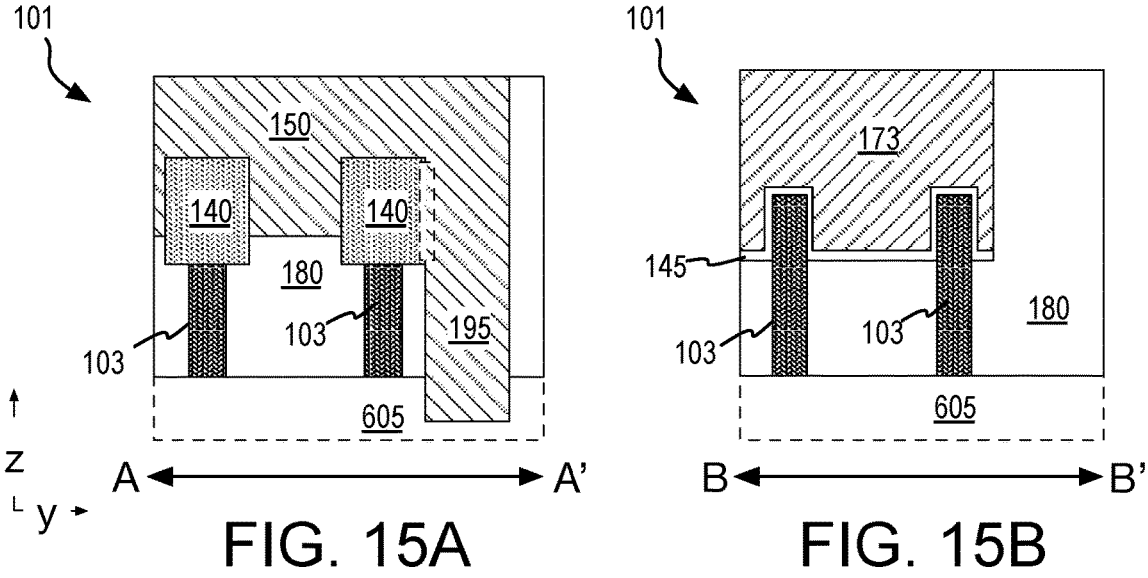
FIG. 15A
FIG. 15B
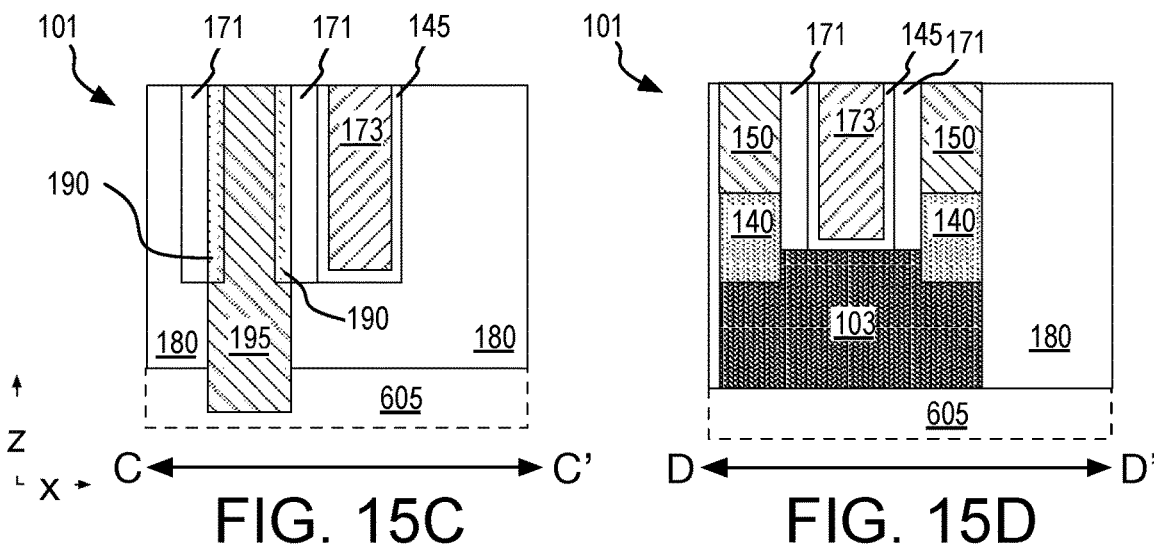
FIG. 15C
FIG. 15D

TRANSISTOR CELLS INCLUDING A DEEP VIA LINED WITH A DIELECTRIC MATERIAL

CLAIM OF PRIORITY

This application is a divisional of, and claims the benefit of priority to, U.S. patent application Ser. No. 16/082,263, filed on Sep. 4, 2018 and titled "TRANSISTOR CELLS INCLUDING A DEEP VIA LINED WITH A DIELECTRIC MATERIAL," which is a National Stage Entry of, and claims the benefit of priority to, PCT Application No. PCT/US2016/025593, filed on Apr. 1, 2016 and titled "TRANSISTOR CELLS INCLUDING A DEEP VIA LINED WITH A DIELECTRIC MATERIAL," which is incorporated by reference in entirety.

BACKGROUND

Transistor cell density in integrated circuits (ICs) continues to increase. As the dimensions of the transistor cell footprint shrink, it is becoming increasingly difficult to scale the lowest interconnect metallization levels and still achieve suitably low external resistance and parasitic capacitance metrics for a transistor. Often, formation of transistor metallization relies on self-alignment techniques, which place the metallization in close proximity to one or more transistor terminals. This can pose difficultly with respect to IC parasitics, such as increased capacitance with a terminal of the transistor.

One way of reducing such capacitance is to reduce the overlap area of the capacitively coupled elements. Within the shrinking transistor cell footprint, this area is becoming dominated by a height or vertical thickness of the elements within the transistor cell as vertical orientations become more popular. Reductions in capacitively coupled area will therefore not likely arise by reducing the so-called z-dimension. Techniques to locally increase lateral spacing between capacitively coupled elements in a manner that enables both vertically-oriented or "deep" metallization suitable for 3D integration and can accommodate further reductions in cell footprints may therefore be advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 6A, 6B, 6C, and 6D illustrate cross-sectional views of a FET after a deep via opening is etched, in accordance with some embodiments;

FIGS. 7A, 7B, 7C, and 7D illustrate cross-sectional views of a FET after a deep via liner landing on a bottom of the via opening is formed, in accordance with some embodiments;

FIGS. 8A, 8B, 8C, and 8D illustrate cross-sectional views of a FET after a deep via opening is filled with source/drain metallization, in accordance with some embodiments;

FIGS. 9A, 9B, 9C, and 9D illustrate cross-sectional views of a FET after a deep via opening is backfilled with a sacrificial material, in accordance with some embodiments;

FIGS. 11A, 11B, 11C, and 11D illustrate cross-sectional views of a FET after forming a deep via dielectric liner landing on sacrificial material, in accordance with some embodiments;

FIGS. 12A, 12B, 12C, and 12D illustrate cross-sectional views of a FET after sacrificial material is removed from the deep via opening, in accordance with some embodiments;

FIGS. 13A, 13B, 13C, and 13D illustrate cross-sectional views of a FET after a deep via opening is filled with source/drain metallization, in accordance with some embodiments;

FIGS. 14A, 14B, 14C, and 14D illustrate cross-sectional views of a FET after a dielectric liner is selectively deposited on a portion of a deep via opening, in accordance with some embodiments;

FIGS. 15A, 15B, 15C, and 15D illustrate cross-sectional views of a FET after a deep via opening is filled with source/drain metallization, in accordance with some embodiments;

DETAILED DESCRIPTION

Figures 1A, 1B:
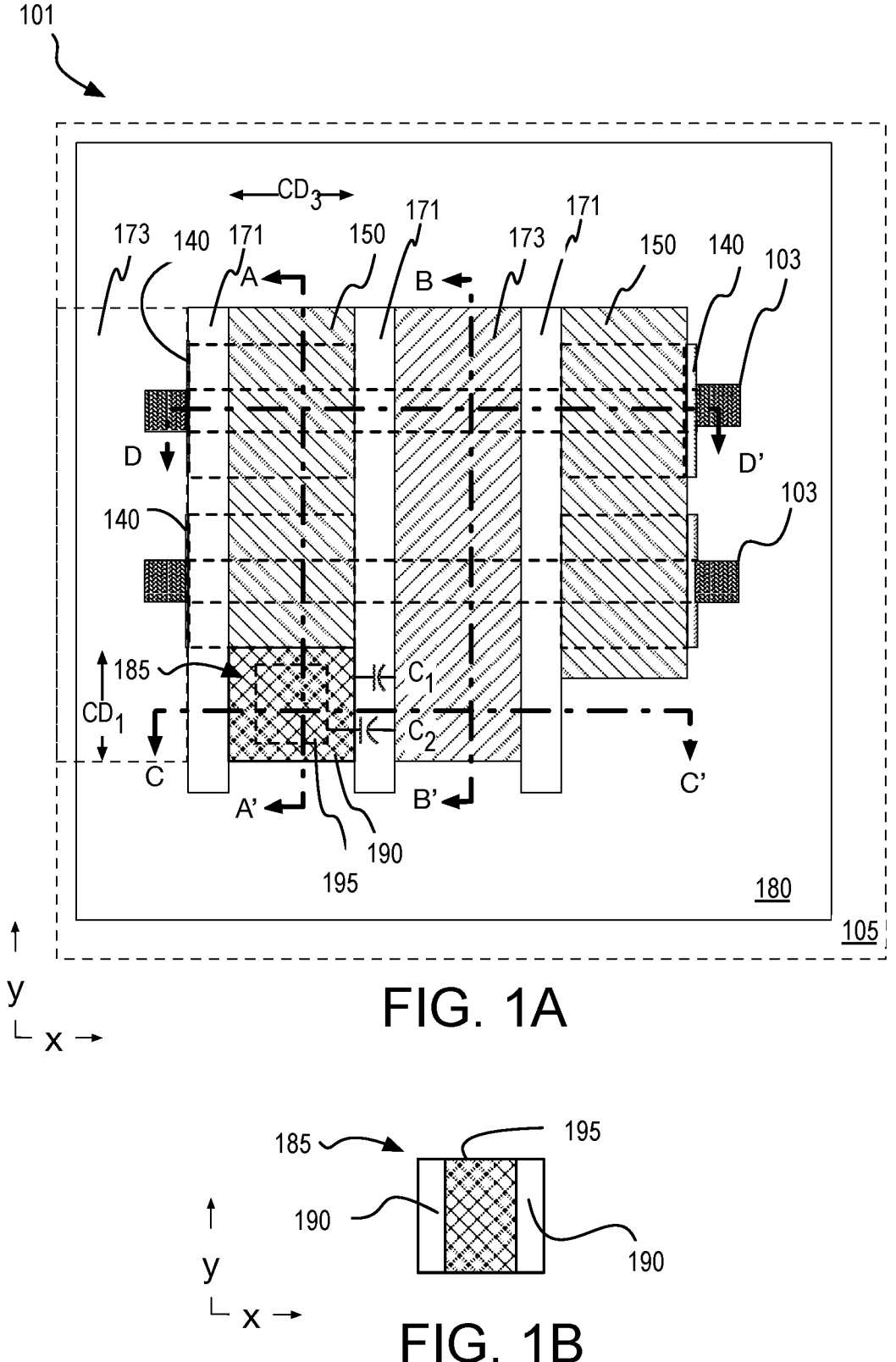
FIG. 1A is a plan view of a FET including a deep source/drain via dielectric liner, in accordance with some embodiments.
FIG. 1B is a plan view of a deep via with a semi-annular deep via dielectric liner, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are transistor cells incorporating a deep via extending from a first side of a transistor semiconductor body to a second side of the transistor semiconductor body, opposite the first side. In some exemplary embodiments where the semiconductor body comprises a fin of semiconductor, the deep via extends the height of at least an active channel region of the fin, and advantageously extends an entire height of the semiconductor fin, including any sub-fin region below the active channel region. In some embodiments, the deep via is disposed adjacent to the transistor semiconductor body but is electrically insulated from (i.e., not directly contacting) at least one of the transistor gate terminal, source terminal, or drain terminal. In some such embodiments, the deep via makes electrical contact to at least one of the gate, source, or drain terminals while being electrically insulated from at least one other of the transistor terminals. In exemplary embodiments described further herein, the deep via includes a dielectric liner layer disposed on at least a portion of the deep via sidewall effectively necking down an electrical cross-section of metallization further disposed within the deep via in a localized region adjacent to a transistor terminal and/or to the semiconductor body. Within the necked region, a greater amount of dielectric separation is disposed between the deep via metallization and the transistor terminal and/or semiconductor body, thereby reducing parasitic capacitance associated with the deep via and portions of the transistor.

In some embodiments, the deep via metallization makes direct electrical contact with (contact) metallization of either the source or drain terminal. For some such embodiments, the dielectric liner of the deep via is recessed relative to the sidewalls of the deep via to facilitate the direct contact between metallization disposed within the deep via and the source/drain metallization. As further described below, techniques to form transistors with a deep via dielectric liner include patterning a deep via opening adjacent to the transistor semiconductor body, and filling the opening with metallization after one or more of liner deposition and liner recessing.

FIG. 1A is a plan view of a logic transistor cell 101 including a field effect transistor (FET) having a deep via 185 further including a dielectric liner 190 standing-off at least a portion of via metallization 195 from other transistor structures, in accordance with some embodiments. In FIG. 1A, solid lines denote salient materials forming a front-side surface of a transistor strata while dashed lines denote salient material interfaces within the transistor strata that are disposed below another overlying material. Heavy dot-dashed lines denote planes along which cross-sectional views are further provided as FIG. 2A-2D. FIG. 1B is a plan view of deep via 185 according to some alternative "semi-annular" liner embodiments where dielectric liner 190 does not wrap completely around deep via metallization 195 as depicted in FIG. 1A. Instead, dielectric liner 190 is localized to one or more discrete portions of the deep via sidewall, for example reducing the lateral dimension of deep via metallization in one dimension (e.g., x-dimension) more than in an orthogonal dimension (e.g., y-dimension).

In further reference to FIG. 1A, FET cell 101 includes a back-side stack 105 formed on a back side of a semiconductor bodies 103 that are embedded within an isolation dielectric material 180. Transistor cell 101 further includes a gate electrode 173 strapping across a channel region of each of a first and a second semiconductor body 103. Although two semiconductor bodies 103 are illustrated in FIG. 1A, a FET may include one or more semiconductor bodies. Semiconductor bodies 103 may have any semiconductor composition known to be suitable for a field effect transistor, such as, but not limited to, group IV materials (e.g., Si, Ge, SiGe), group III-V materials (e.g., GaAs, InGaAs, InAs, InP), or group III-N materials (e.g., GaN, AlGaN, InGaN). In some advantageous embodiments, semiconductor bodies 103 are monocrystalline.

Source and drain metallization 150 is disposed on opposite sides of gate electrode 173 and also extends across semiconductor bodies 103. In the illustrated embodiment, source/drain metallization 150 is disposed on a raised source/drain semiconductor 140, which is further disposed on semiconductor bodies 103. Source/drain semiconductor 140 is heavily-doped with electrically active impurities imparting n-type or p-type conductivity. For exemplary embodiments where transistor cell 101 is a conventional FET, both the source and drain semiconductor 140 is doped to the same conductivity type (e.g., n-type for NMOS and p-type for PMOS). In alternative embodiments (e.g., for a tunneling FET), the source/drain semiconductor 140 may be doped complementarily. Source/drain semiconductor 140 may be any semiconductor material compatible with semiconductor bodies 103, such as group IV materials (e.g., Si, Ge, SiGe), and/or group III-V materials (e.g., InGaAs, InAs).

An electrically insulating dielectric spacer 171 laterally separates gate electrode 173 from source/drain metallization 150 and/or source/drain semiconductor 140. Source/drain metallization 150 may include one or more metals, such as Ti, W, Pt, their alloys, and nitrides, that form an ohmic or tunneling junction with doped source/drain semiconductor 140. Dielectric spacer 171 also laterally separates gate electrode 173 from deep source/drain via 185. In the illustrative embodiment, deep via 185 is disposed between two stripes of dielectric spacer 171. Dielectric spacer 171 may be or any conventional dielectric such as, but not limited to, silicon dioxide, silicon nitride, or silicon oxynitride. Dielectric spacer 171 may also be any known low-k material having a relative permittivity below 4.0.

Although only one gate electrode 173 is illustrated in solid line as being part of a single logic cell, an exemplary second gate electrode 173 is drawn in dashed line as being associated with an adjacent cell. The second gate electrode is also laterally separated from deep via 185 by dielectric spacer 171. Deep via 185 is at least partially filled with via metallization 195. Dielectric liner 190 denoted by dashed lines within deep via 185 laterally separates at least some portion of via metallization 195 from adjacent transistor structures by some amount in addition to the spacing provided by dielectric spacer 171. In some embodiments, dielectric liner 190 wraps radially around deep via metallization 195 forming a continuous, annular perimeter surrounding deep via metallization 195, as shown in FIG. 1A. However, in other embodiments, deep via 185 is lined with a plurality of discrete vertically-oriented stripes, for example forming a semi-annular liner as depicted in FIG. 1B.

External on-state resistance of transistor cell 101 is associated with the lateral critical dimension (CD) of semiconductor body 103 between the channel region and the semiconductor source/drain 140. Hence, while the lateral CD of dielectric spacer 171 is important to minimize for lowest external source/drain resistance, parasitic capacitance between a metallized deep via and gate electrode increases as dielectric spacer CD is reduced. Hence, while dielectric spacer 171 may be a useful feature for positioning deep via 185 relative to the terminals of transistor cell 101 (e.g., so as to avoid electrical shorts to gate electrode 173), the minimal lateral CD of dielectric spacer 171 would result in a significant deep via parasitic capacitance $C_1$. In accordance with some embodiments, dielectric liner 190 is disposed along at least a portion of the sidewall of deep via 185, for example to locally increase lateral separation between gate electrode 173, and metallization is disposed within deep via 185. The presence of liner 190 may thereby reduce parasitic capacitance to a lower value of $C_2$. In some exemplary embodiments, dielectric spacer 171 has a CD of 2-7 nm and liner 190 also has a lateral dimension of 1-7 nm. As described further below, etching a deep via of largest CD followed by forming a liner on the deep via sidewalls holds advantages over simply etching a deep via of smaller CD.

Dielectric liner 190 may have any known composition. In some embodiments, the composition of dielectric liner 190 is the same as that of dielectric spacer 171, effectively thickening dielectric spacer 171 locally around deep via 185. In some advantageous embodiments, dielectric liner 190 has a different composition than dielectric spacer 171. In some further embodiments, dielectric liner 190 has a different composition than isolation dielectric 180. In some such embodiments, dielectric liner 190 is of dielectric material having a lower bulk relative permittivity than dielectric spacer 171 for a greater reduction in parasitic capacitance. In some such embodiments, dielectric liner 190 is of dielectric material having a lower bulk relative permittivity than isolation dielectric 180 for an even greater reduction in parasitic capacitance. For example, dielectric liner 190 may be any known low-k material having a relative permittivity below 4.0, or any conventional dielectric such as, but not limited to, silicon dioxide, silicon nitride, or silicon oxynitride.

Figure 2A:
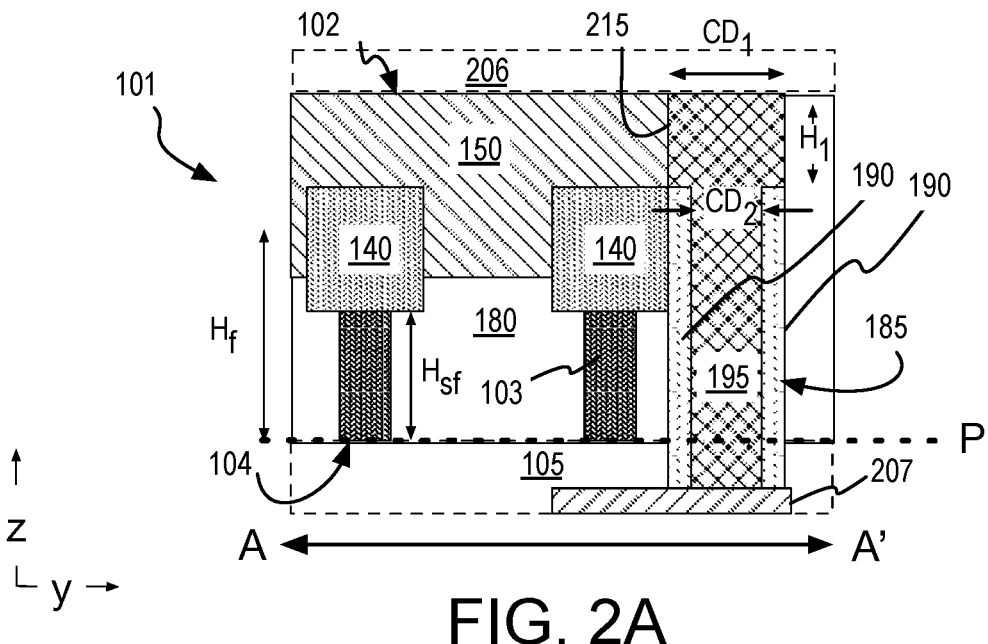
FIG. 2A is a cross-sectional view of a FET including a deep source/drain via dielectric liner along the A-A' plane denoted in FIG. 1A, in accordance with some embodiments.

FIG. 2A is a cross-sectional view of FET 101 along the A-A' plane denoted in FIG. 1A, in accordance with some embodiments. In the illustrative embodiment, deep via 185 spans the entire semiconductor body z-height $H_f$, and extends between front-side cell surface 102 and a plane P intersecting a bottom, or back-side cell surface 104. Disposed over front-side cell surface 102 is a front-side stack 206. Disposed over back-side cell surface 104 is a back-side stack 105. Deep via 185 may extend any depth into back-side stack 105. Front-side stack 206 and back-side stack 105 are illustrated in dashed line as not being part of the transistor cell strata and only provide a contextual reference illustrating what deep via 185 may intersect. In the exemplary embodiment, back-side stack 205 includes at least a back-side lateral interconnect 207 and some dielectric insulating that interconnect from other features. For embodiments herein, the architecture of back-side stack 105 may vary without limitation. Back-side stack 105 may include any carrier known to be suitable for supporting a transistor cell strata. For example, back-side stack 105 may be one or more materials from which semiconductor bodies 103 were fabricated. For silicon semiconductor bodies, back-side stack 105 may include a thin crystalline group IV substrate, such as Si. For group III-V semiconductor bodies, back-side stack 105 may include a crystalline III-V material, such as GaAs, or a group IV substrate, such as Si. Alternatively, back-side stack 105 may include a material to which the strata including transistor cell 101 was transferred, or which was deposited onto a back-side of cell 101, before or after deep via 185 was fabricated. For example, back-side stack 105 may include another transistor cell strata, a polymer sheet, a plurality of thin films, or any other material(s) built up over a back side of semiconductor bodies 103.

The architecture of front-side stack 206 may vary without limitation and the amount by which deep via 185 extends into front-side stack 206 may also vary without limitation. Front-side stack 206 may include any carrier known to be suitable for supporting a strata of transistor cells. For example, front-side stack 206 may include a crystalline group IV substrate, such as Si. Alternatively, front-side stack 206 may include a crystalline III-V material, such as GaAs. In still other embodiments, front-side stack 206 may be one or more materials to which the strata including transistor cell 101 was transferred, or one or more thin film materials that were deposited onto a front-side of cell 101 before or after deep via 185 was fabricated. For example, front-side stack 206 may include another transistor cell strata, a polymer sheet, a plurality of thin films, or any other material(s) built up over a front side of semiconductor bodies 103.

As further shown in FIG. 2A, semiconductor bodies 103 are embedded in isolation dielectric 180, which interfaces back-side stack 105 at the plane P. Isolation dielectric 180 may be one or more materials known to be suitable for providing electrical isolation between transistors. In some exemplary embodiments, isolation material 180 is silicon dioxide. Other materials known to be suitable for the purpose may also be utilized, including low-k materials (e.g., having a bulk relative permittivity below 4.0).

In some embodiments illustrated by FIG. 2A, deep via 185 is laterally aligned with source/drain semiconductor 140. Dielectric liner 190 is in direct contact with source/drain semiconductor 140 (e.g., in direct contact with a sidewall). In some embodiments where, source/drain semiconductor 140 is a raised epitaxial regrowth material, the lateral width of source/drain semiconductor 140 (e.g., y-dimension) may also be larger than that of a semiconductor body 103 such that isolation dielectric 180 is present between deep via 185 and semiconductor body 103 as further shown in FIG. 2A. For such embodiments, dielectric liner 190 may be in direct contact with isolation dielectric 180 and source/drain semiconductor 140.

In some embodiments, dielectric liner 190 is in direct contact with a bottom surface of deep via 185. For example, as shown in FIG. 2A, dielectric liner 190 intersects back-side stack 105 at substantially the same plane intersected by via metallization 195. In some exemplary embodiments, dielectric liner 190 is recessed a height $H_1$, below a front-side surface of source/drain metallization 150, and deep via metallization 195 makes direct contact with source/drain metallization 150, extending laterally (e.g., in the y-dimension) over dielectric liner 190. For such embodiments, deep via 185 is referred to herein as a "deep source/drain via," which electrically interconnects a source or drain terminal of transistor cell 101 to a circuit element (not depicted) by way of back-side stack 105. In regions where dielectric liner 190 is recessed, deep via metallization 195 has a larger lateral dimension $CD_1$. Where dielectric liner 190 is present, deep via metallization 195 has a smaller ("necked") dimension $CD_2$. In some embodiments, deep via metallization 195 has a composition distinct from that of source/drain metallization 150, in which case a compositional interface 215 of the two metals may be aligned with the interface between source/drain semiconductor 140 and dielectric liner 190, as shown in FIG. 2A. In alternative embodiments, deep via metallization 195 may have the same composition as source/drain metallization 150, in which case there is no compositional interface 215.

In some embodiments, dielectric liner 190 is not recessed by height $H_1$, and instead extends the full height $H_1$. For such embodiments, dielectric liner 190 may further serve to electrically insulate deep via metallization 195 from the source/drain metallization 150. Deep via 185 is then completely isolated from all terminals of transistor cell 101 as an electrical interconnect passing through the transistor cell strata.

Figure 2B:
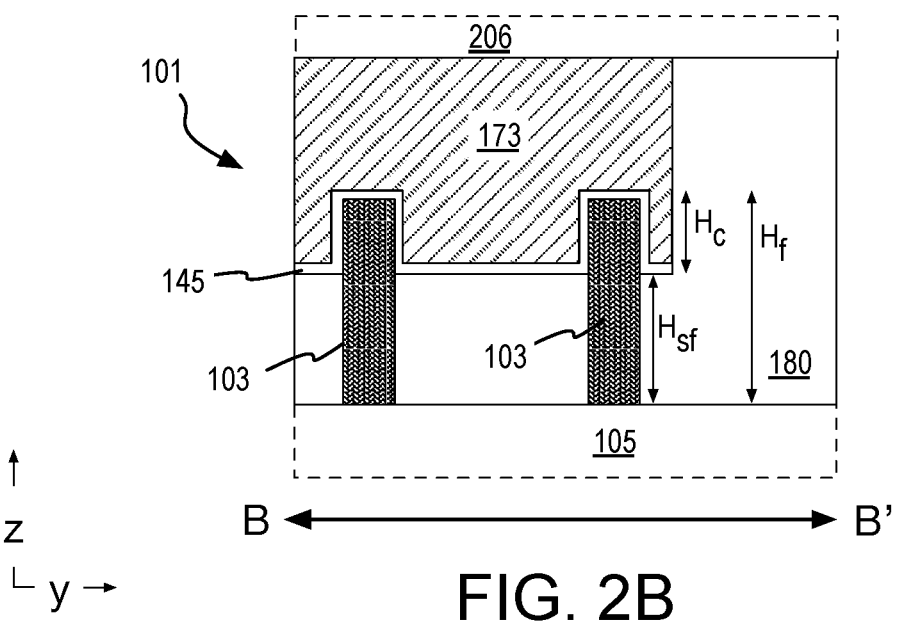
FIG. 2B is a cross-sectional view of a FET including a deep source/drain via dielectric liner along the B-B' plane denoted in FIG. 1A, in accordance with some embodiments.

FIG. 2B is a cross-sectional view of FET 101 along the B-B' plane denoted in FIG. 1A, in accordance with some embodiments. As shown, a gate stack including gate electrode 173 over a gate dielectric 145 is disposed over channel portions of semiconductor bodies 103. Semiconductor body channel portions are coupled to the gate stack and have a sidewall height $H_c$, below which is the sub-fin having a z-height of $H_{sf}$. While any gate stack materials known to be suitable for semiconductor bodies 103 may be utilized, in some exemplary embodiments the gate stack includes a high-k dielectric material (with a bulk relative permittivity greater than 9) and a metal gate electrode having a work function suitable for semiconductor bodies 103. Exemplary high-k materials include metal oxides, such as, but not limited to $Al_2O_3$, $HfO_2$, $HfAlO_x$. Silicates, such as, but not limited to $HfSiO_x$, or $TaSiO_x$ may also be suitable for some semiconductor body compositions (e.g., Si, Ge, SiGe, III-V). Gate electrode 173 may advantageously have a work function below 5 eV and may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed in gate electrode 173, such as, but not limited to, C, Ta, W, Pt, and Sn.

Figure 2C:
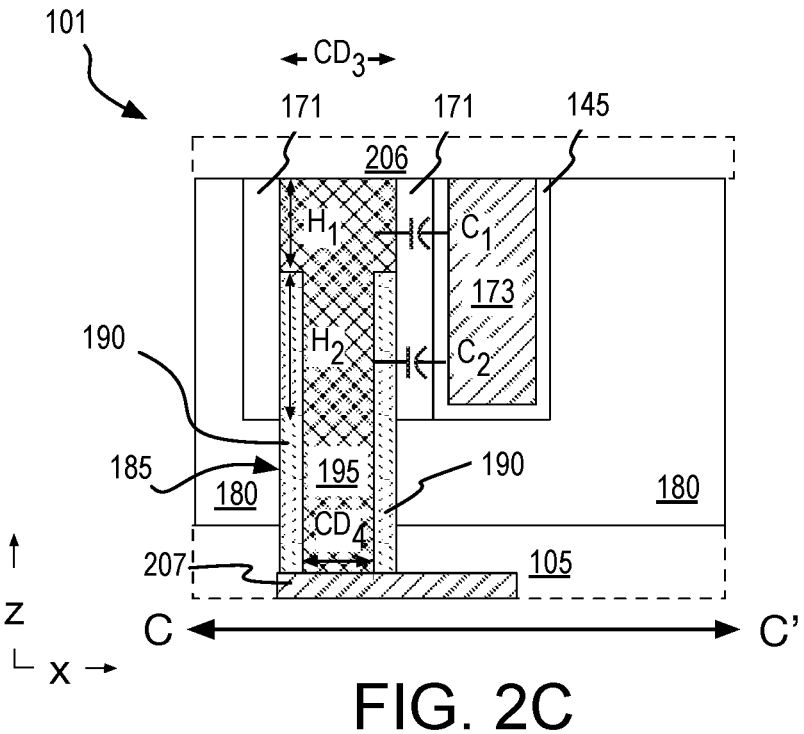
FIG. 2C is a cross-sectional view of a FET including a deep source/drain via dielectric liner along the C-C' plane denoted in FIG. 1A, in accordance with some embodiments.
Figure 2D:
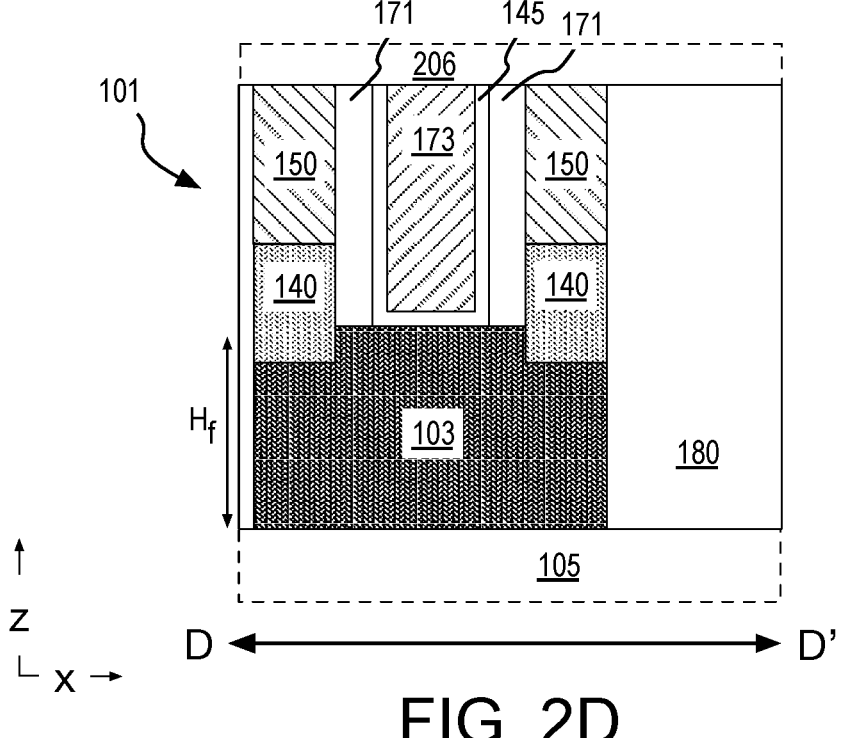
FIG. 2D is a cross-sectional view of a FET including a deep source/drain via dielectric liner along the D-D' plane denoted in FIG. 1A, in accordance with some embodiments.

FIG. 2C is a cross-sectional view of FET 101 along the C-C' plane denoted in FIG. 1A, in accordance with some embodiments. FIG. 2C illustrates a lower capacitance $C_2$ associated with deep via metallization 195 and gate electrode 173 where dielectric liner 190 is disposed in contact with dielectric spacer 171 over the longitudinal deep via length $H_2$. In advantageous embodiments where deep via 185 spans a lateral distance $CD_3$ between two adjacent dielectric spacers 171, a top portion of deep via 185 spanning longitudinal via length $H_1$ has the same lateral dimension as the source/drain metallization. Larger capacitance $C_1$ is limited to a portion of deep via 185 where dielectric liner 190 is recessed by $H_1$, making direct contact with source metallization. In some embodiments, as further shown in FIG. 2C, at least a portion of deep via metallization 195 is separated from gate electrode 173 by dielectric liner 190, dielectric spacer 171, and gate dielectric 145. FIG. 2D is a cross-sectional view of FET 101 along the D-D' plane denoted in FIG. 1A, in accordance with some embodiments. FIG. 2D further illustrates the longitudinal length of semiconductor body 103 between source and drain ends. The front-side surface of gate electrode 173, with which the deep via metallization is planarized, is also planarized with a front-side surface of source/drain contact metallization 150 and isolation dielectric 180.

Figure 3A:
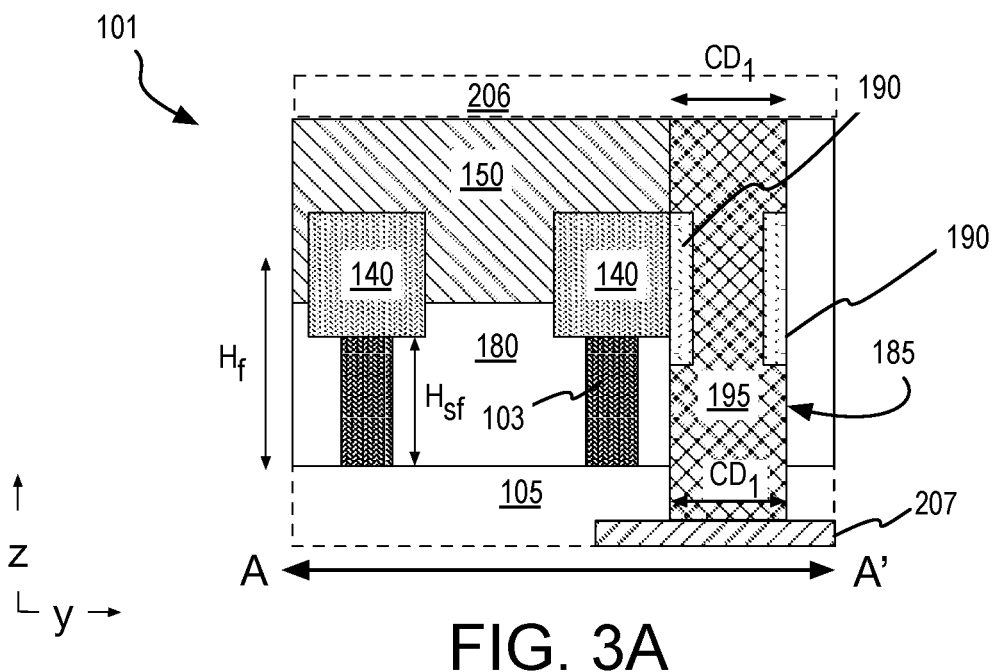
FIG. 3A is a cross-sectional view of a FET including a deep source/drain via dielectric liner along the A-A' plane denoted in FIG. 1A, in accordance with some alternative embodiments.

In some embodiments, a deep via dielectric liner is localized to a longitudinal length of the deep via immediately adjacent to the gate electrode. For such embodiments, a current carrying length of the deep via that is necked down for reduced parasitic capacitance is minimized for reduced deep via resistance. FIG. 3A is a cross-sectional view of FET 101 along the A-A' plane denoted in FIG. 1A, in accordance with some alternative embodiments where dielectric liner 190 is localized to a partial longitudinal length of the deep via that is immediately adjacent to the gate electrode. Unlike embodiments described above (e.g., in reference to FIG. 2A), liner 190 does not intersect a bottom surface of deep via 185. Dielectric liner 190 extends over a longitudinal length of deep via 185 that is less the fin height $H_f$. As further shown in FIG. 3A, deep via 185 has the larger lateral diameter of $CD_1$ at the intersection of back-side stack 105. For source/drain deep via embodiments where deep via metallization 195 is in direct contact with source/drain metallization 150, dielectric liner 190 is again recessed from a top surface of source/drain metallization 150 by a longitudinal via length $H_1$.

Figure 3B:
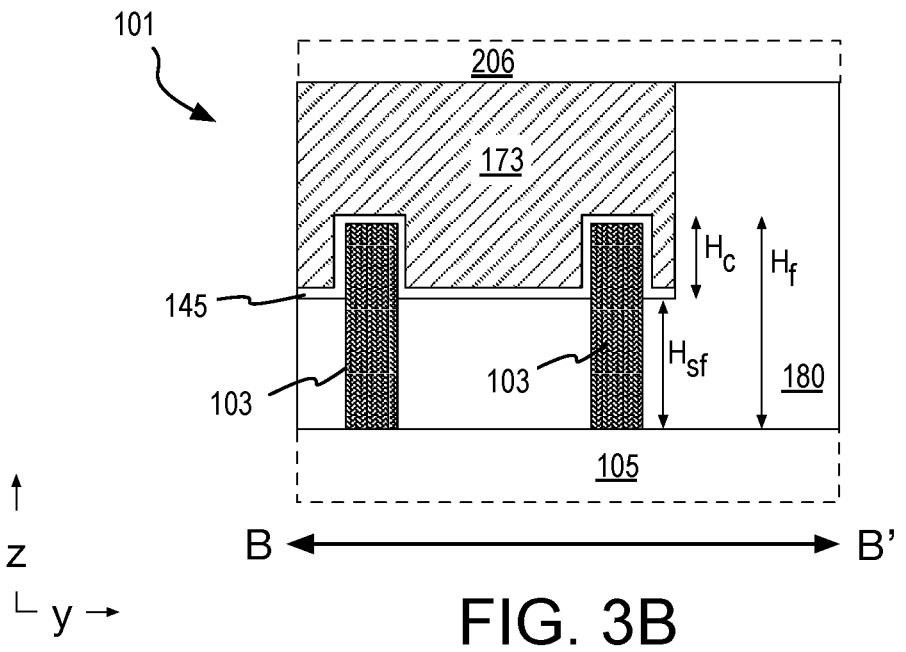
FIG. 3B is a cross-sectional view of a FET including a deep source/drain via dielectric liner along the B-B' plane denoted in FIG. 1A, in accordance with some alternative embodiments.
Figure 3C:
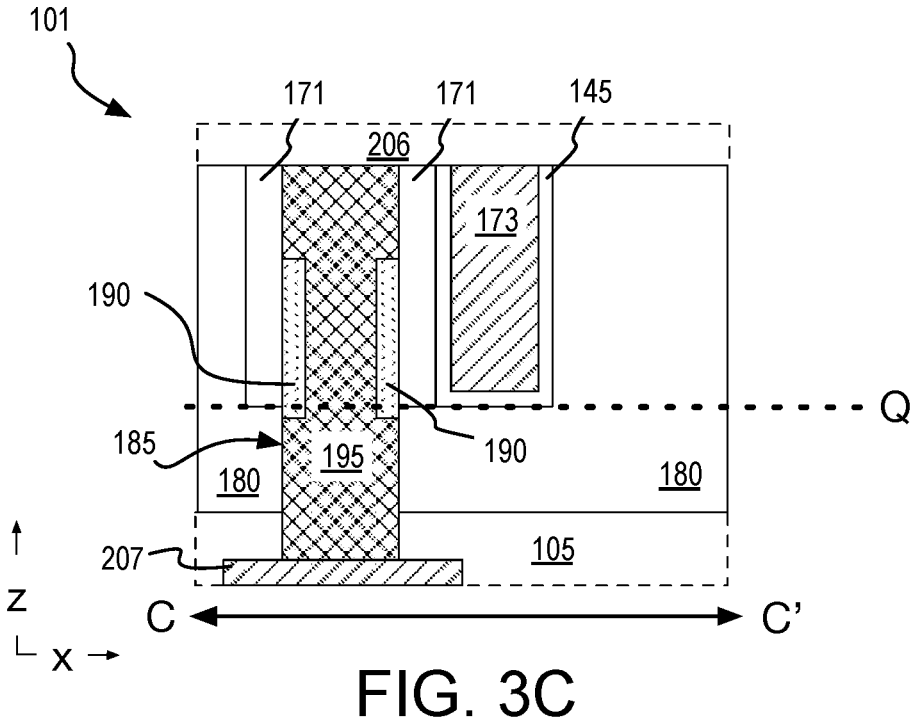
FIG. 3C is a cross-sectional view of a FET including a deep source/drain via dielectric liner along the C-C' plane denoted in FIG. 1A, in accordance with some alternative embodiments.
Figure 3D:
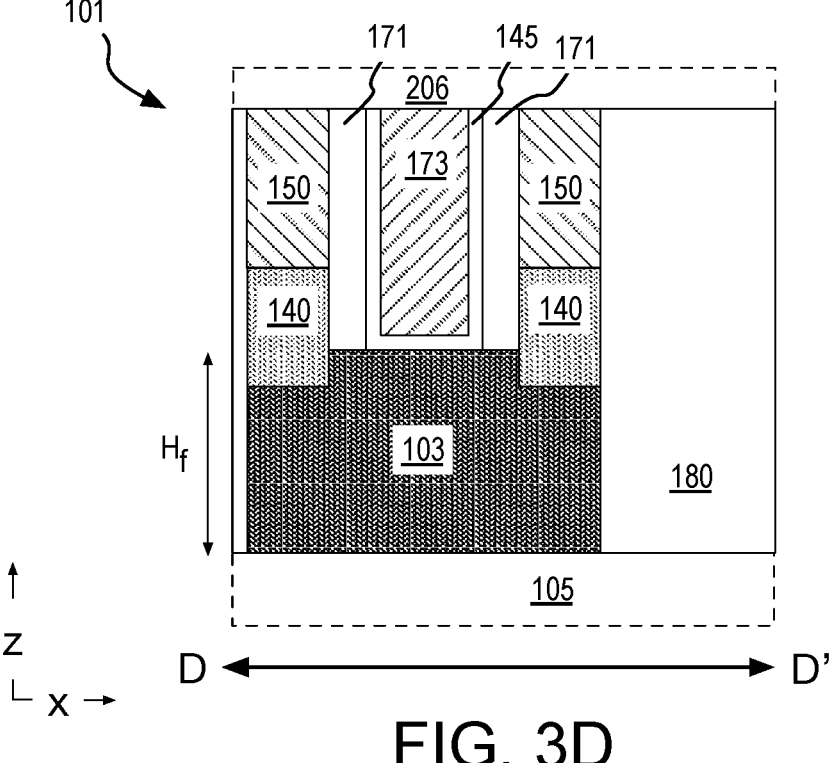
FIG. 3D is a cross-sectional view of a FET including a deep source/drain via dielectric liner along the D-D' plane denoted in FIG. 1A, in accordance with some alternative embodiments.

FIG. 3B is a cross-sectional view of FET 101 along the B-B' plane denoted in FIG. 1A, in accordance with some alternative embodiments where the deep via dielectric liner is localized to a partial longitudinal length of the deep via that is immediately adjacent to the gate electrode. In FIG. 3B, gate electrode 173 straps over semiconductor body 103 having a sidewall height of $H_f$, defining a channel portion with a sidewall height $H_c$ disposed over a subfin portion having a sidewall height $H_{sf}$. FIG. 3C is a cross-sectional view of FET 101 along the C-C' plane denoted in FIG. 1A, in accordance with some alternative embodiments where dielectric liner 190 is localized to a partial longitudinal length of the deep via that is immediately adjacent to the gate electrode. As shown, dielectric liner 190 only extends to a plane Q that intersects a bottom surface of the gate stack. For such embodiments, dielectric liner 190 may land approximately at plane Q as a function of process variation. FIG. 3D is a cross-sectional view of FET 101 along the D-D' plane denoted in FIG. 1A, in accordance with some alternative embodiments where the deep via dielectric liner is localized to a partial longitudinal length of the deep via that is immediately adjacent to the gate electrode. Features illustrated in FIG. 3D are substantially the same as those illustrated in FIG. 2D.

Figure 4A:
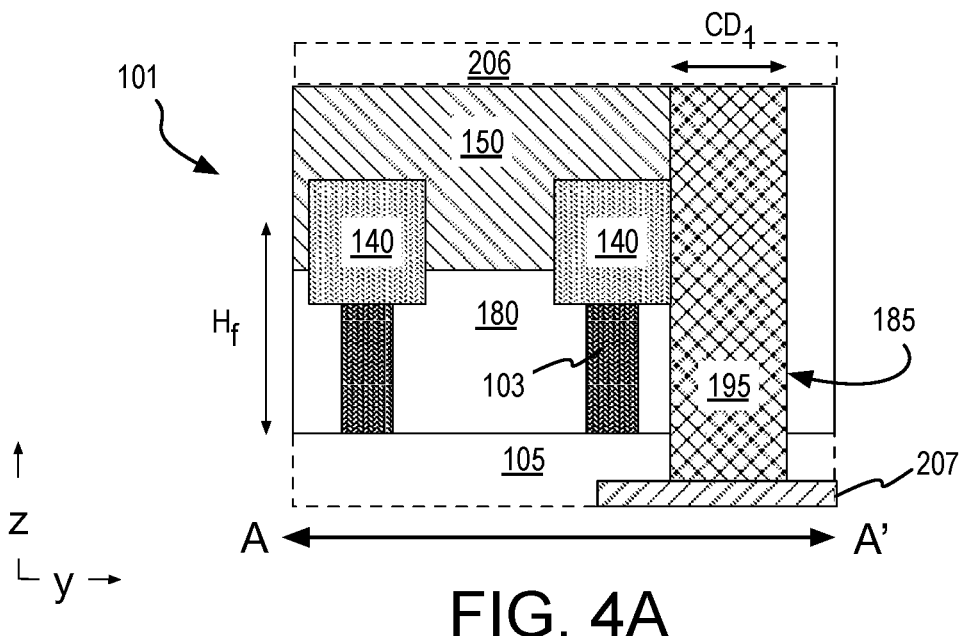
FIG. 4A is a cross-sectional view of a FET including a deep source/drain via dielectric liner along the A-A' plane denoted in FIG. 1A, in accordance with some alternative embodiments.

In accordance with some embodiments, a deep via dielectric liner is radially localized to a portion of the deep via immediately adjacent to the gate electrode, for example as illustrated in FIG. 1B. FIG. 4A is a cross-sectional view of FET 101 along the A-A' plane denoted in FIG. 1A, in accordance with some alternative embodiments where the deep via liner does not completely wrap around the deep via metallization and is instead is only disposed on a fraction of the deep via sidewall that interfaces with dielectric spacer material. Other portions of the deep via sidewall, for example comprising source/drain semiconductor or isolation dielectric, remain substantially free of the deep via dielectric liner. For such embodiments, the diameter of deep via 185 within the A-A' plane is the larger $CD_1$ over at least the entire longitudinal semiconductor body sidewall height $H_f$ because the liner is absent from the deep via sidewalls within the A-A' plane. Deep via metallization 195 therefore makes direct contact with both source/drain semiconductor 140 and isolation dielectric 180.

Figure 4B:
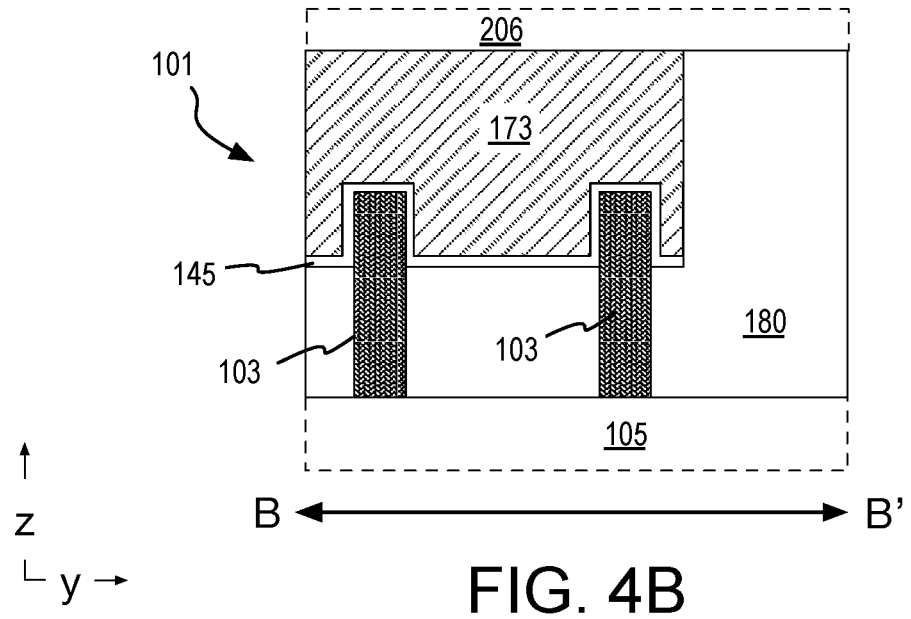
FIG. 4B is a cross-sectional view of a FET including a deep source/drain via dielectric liner along the B-B' plane denoted in FIG. 1A, in accordance with some alternative embodiments.
Figure 4C:
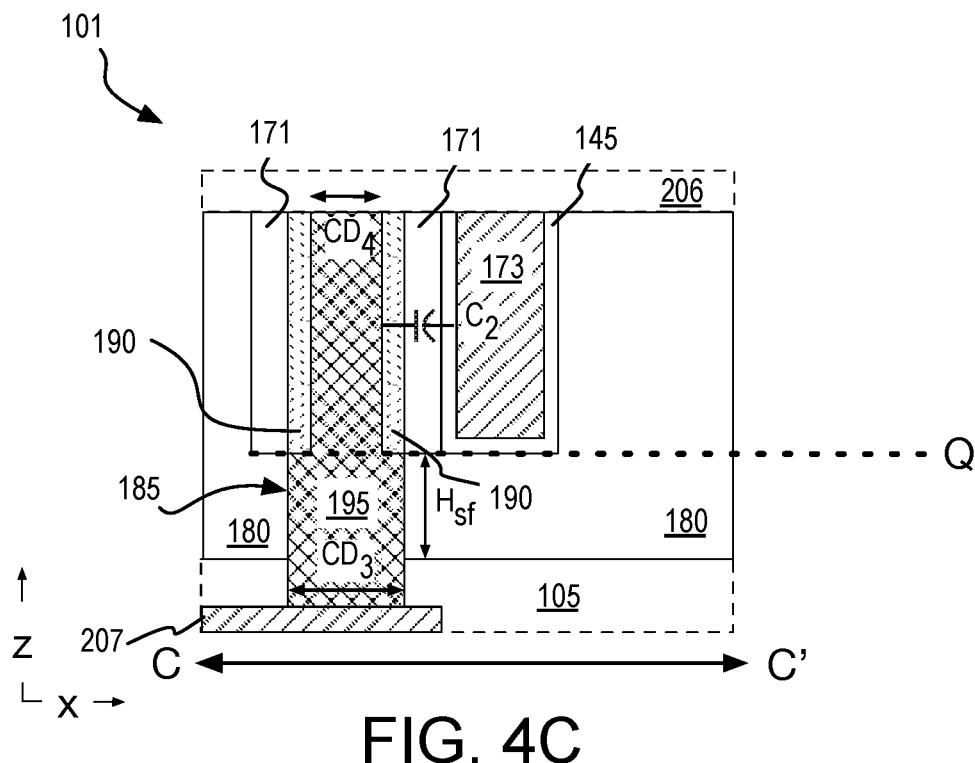
FIG. 4C is a cross-sectional view of a FET including a deep source/drain via dielectric liner along the C-C' plane denoted in FIG. 1A, in accordance with some alternative embodiments.
Figure 4D:
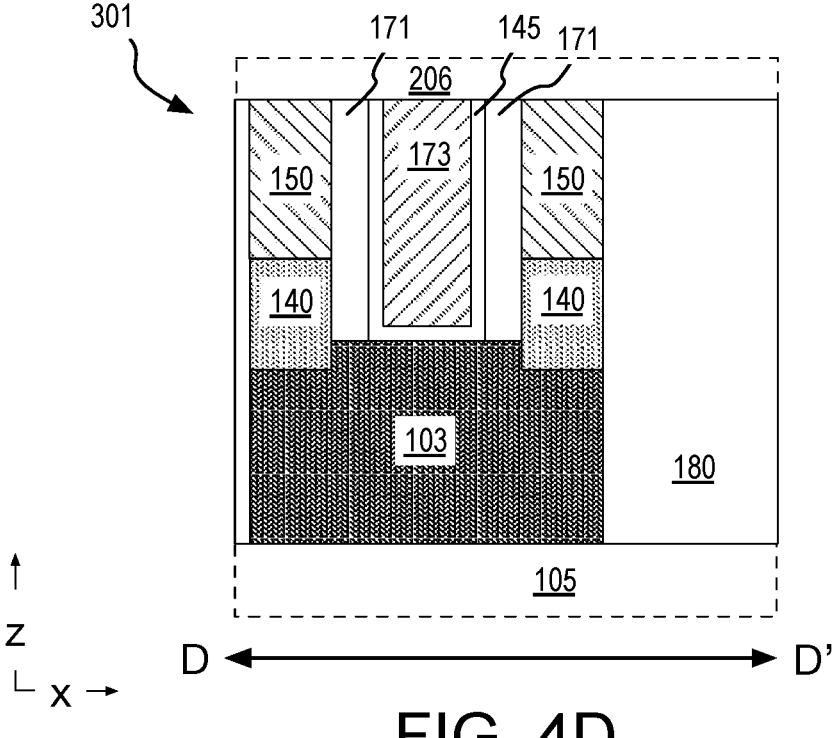
FIG. 4D is a cross-sectional view of a FET including a deep source/drain via dielectric liner along the D-D' plane denoted in FIG. 1A, in accordance with some alternative embodiments.

FIG. 4B is a cross-sectional view of FET 101 along the B-B' plane denoted in FIG. 1A, in accordance with some alternative embodiments in which the deep via dielectric liner is radially localized to a portion of the deep via immediately adjacent to the gate electrode. Within the B-B' plane, FET 101 has substantially the same architecture as that described above in the context of FIGS. 2B and 3B. FIG. 4C is a cross-sectional view of FET 101 along the C-C' plane denoted in FIG. 1A, in accordance with some alternative embodiments in which the deep via dielectric liner is radially localized to a portion of the deep via immediately adjacent to the gate electrode. Deep via liner 190 is in direct contact with dielectric spacer 171 and extends to plane Q intersecting a bottom surface of the gate stack. Precise z-height alignment of liner 190 to dielectric spacer 171 is indicative of a selective deposition process, for example as described further below. As further illustrated in FIG. 4C, dielectric liner 190 is substantially planar with a top surface of gate electrode 173, having no recess. As such, the diameter of deep via metallization 195 within the C-C' plane is the smaller $CD_4$ along the entire z-height of gate electrode 173, and is the larger $CD_3$ along remaining longitudinal length that is at least equal to $H_{sf}$. FIG. 4D is a cross-sectional view of FET 101 along the D-D' plane denoted in FIG. 1A, in accordance with some alternative embodiments in which the deep via dielectric liner is radially localized to a portion of the deep via immediately adjacent to the gate electrode. The features illustrated in FIG. 4D are substantially the same as those illustrated in FIGS. 2D and 3D.

Figure 5A:
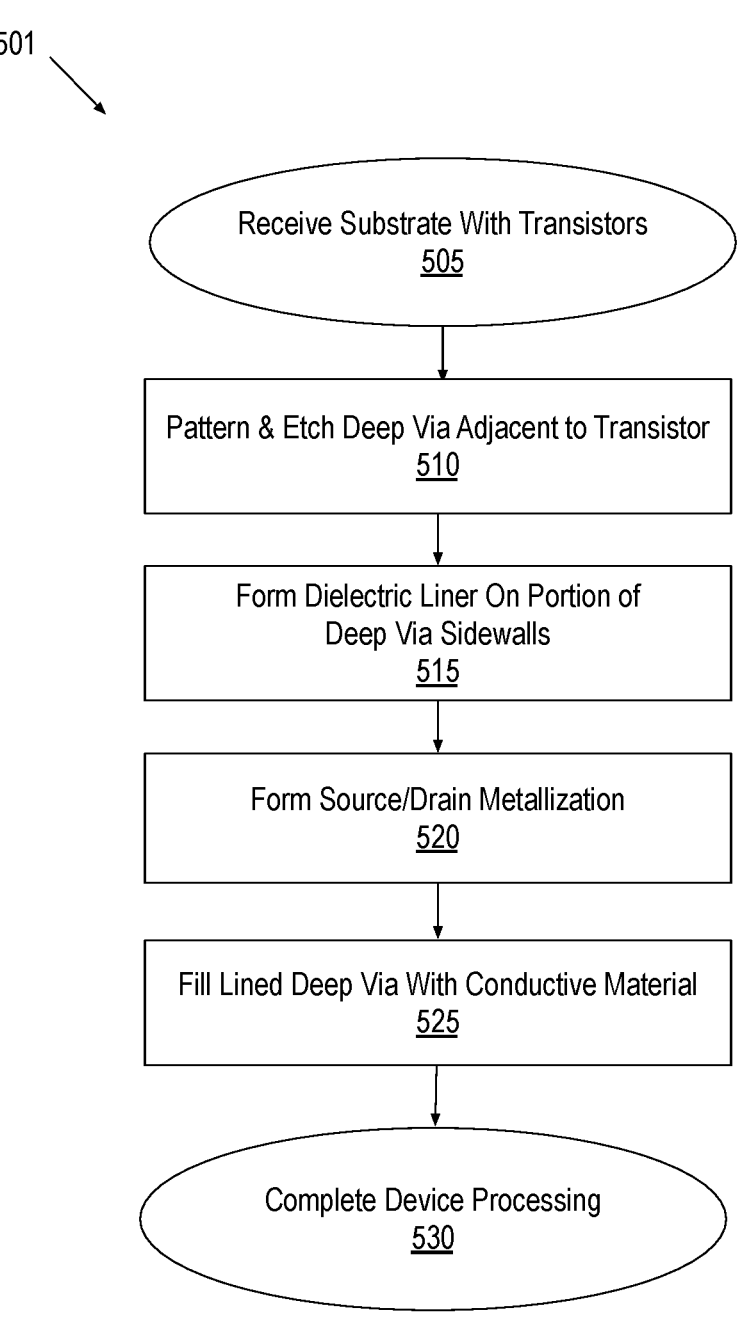
FIG. 5A is a flow diagram illustrating methods for fabricating a FET including a deep source/drain via dielectric liner, in accordance with some embodiments.

FETs including a deep via dielectric liner, for example including one or more of the features described above, may be fabricated by a variety of methods applying a variety of techniques and processing chamber configurations. FIG. 5A is a flow diagram illustrating a method 501 for fabricating a FET including a deep source/drain via dielectric liner, in accordance with some embodiments. Method 501 begins with receiving a back-side substrate supporting a strata of transistors. The back-side substrate received may be one or more materials from which the transistor channel semiconductor was derived. For example, in some silicon-channeled transistor embodiments, the back-side substrate received at operation 505 is a crystalline group IV substrate, such as Si. For some group III-V-channeled transistor embodiments, the back-side substrate received at operation 505 may be a crystalline III-V material, such as GaAs. The transistors disposed on the back-side substrate received at operation 505 may have any known architecture. For example, the transistors may be FETs with any planar or non-planar gate/channel architecture with each transistor cell including one source terminal, one drain terminal, and one gate terminal.

Method 501 continues at operation 510 where a deep via is patterned and etched within an area occupied by one transistor cell. The deep via may patterned and etched to define a maximum via dimension, with one or more sidewall self-aligned to a transistor feature, such as a dielectric spacer and/or source/drain semiconductor. Depending on the x-y dimensions, the via may be considered a "trench" (e.g., having a longer y-dimension than x-dimension). At operation 515, a dielectric liner is formed on at least a portion of the sidewall of the deep via that was etched at operation 520. The dielectric liner is formed in a manner that locally reduces the dimension of the via in regions most proximate to adjacent transistor feature that may otherwise more strongly capacitively couple. At operation 525, one or more metal (or other suitably conductive material) is deposited into the lined deep via. Device processing is then completed at operation 530 using any known techniques. In some embodiments, device processing incudes formation of a front-side stack including any suitable carrier applied (e.g., bonded) to a front side of the transistor strata. The back-side substrate may then be thinned into a back-side stack that interconnects with the deep via, and/or the back-side substrate is replaced with such a back-side stack. For example, any known grind, and/or polish, and/or layer transfer process may be employed to reveal a back side of the deep via.

Figure 5B:
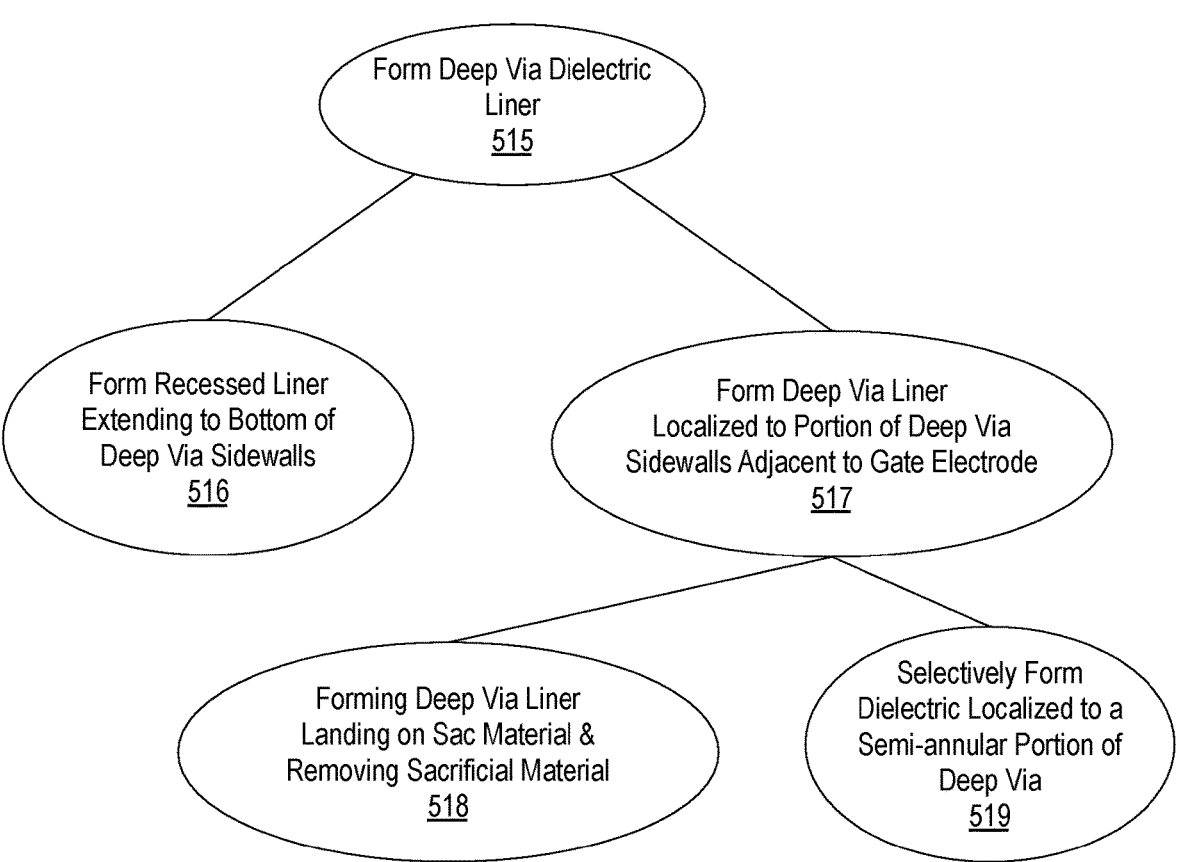
FIG. 5B illustrates methods of forming a deep via dielectric liner, in accordance with some embodiments.

FIG. 5B illustrates methods for forming a deep via dielectric liner at operation 515, in accordance with some embodiments. In some embodiments, operation 515 further entails operation 516 where the deep via dielectric liner is formed over an entirety of the deep via sidewall and then recessed etched to remove the liner from a top portion of the deep via sidewall. FIG. 6A-8D further illustrate cross-sectional views of a FET evolving as method 501 is practiced in an embodiment including operation 516. In some alternative embodiments, operation 515 further entails operation 517 where the deep via dielectric liner is formed over only a localized portion of the deep via sidewalls adjacent to the gate electrode. In some such embodiments, operation 517 further entails forming the deep via dielectric liner over a sacrificial material that partially backfills the deep via at operation 518. After formation of the dielectric liner, the sacrificial material may then be removed in preparation for backfilling with one or more metals. FIG. 9A-13D further illustrate cross-sectional views of a FET evolving as an embodiment of method 501 including operation 518 is practiced. In some other embodiments, operation 517 further entails selective liner formation at operation 519 where the dielectric liner is formed on certain materials exposed at the deep via sidewall selectively to other materials present at the deep via sidewall. FIG. 14A-15D further illustrate cross-sectional views of a FET evolving as an embodiment of method 501 including operation 519 is practiced.

FIGS. 6A, 6B, 6C, and 6D illustrate cross-sectional views of a FET 101 after a deep via opening 606 is etched, in accordance with some embodiments of operation 510 (FIG. 5A). The sections illustrated in FIGS. 6A, 6B, 6C, and 6D are along the A-A', B-B', C-C', and D-D' planes, respectively, as shown in heavy dot-dashed line in FIG. 1A. Hence, the four views shown in FIG. 6A-6D are the same views employed above to describe structural features of FET 101. Various elements of transistor cell 101 introduced above are shown with the same reference number for clarity. Notably however, back-side substrate 605 illustrated in FIG. 6A-6D need not be back-side stack 105 illustrated in FIG. 1A-4D. In some exemplary embodiments, back-side substrate 605 is a crystalline semiconductor substrate (e.g., Si) from which semiconductor bodies 103 were formed. Following deep via formation, a front-side stack including any suitable carrier maybe applied to a front side of the transistor strata. Back-side substrate 605 may then be thinned into back-side stack 105 and/or replaced with back-side stack 105, for example using any known grind, and/or polish, and/or layer transfer process.

Any known patterning technique may be employed to form deep via opening 606, such as a lithographic patterning of a photosensitive material and an anisotropic dry etch through the thickness of isolation dielectric 180 surrounding semiconductor bodies 103. Any etch process known to be suitable for anisotropically etching isolation dielectric 180 may be employed. In some embodiments, the deep via opening 606 is patterned with a mask that has an opening dimension larger than that of the deep via, in at least partial reliance on self-aligning a bottom of the via opening through selectivity of the etch process. For example, in FIG. 6A, deep via opening 606 has a lateral dimension of $CD_1$ that may be between 100 nm, 50 nm, or even less, at an intersection with back-side stack 105. However, the mask opening employed in the deep via etch may be larger, for example having a lateral dimension of $CD_P$ that exposes a portion of source/drain semiconductor 140. Semiconductor 140 then serves as a supplemental mask during the deep via etch, self-alignedly confining the deep via opening 606. Deep via opening 606 may be etched to any depth as needed to intersect the interface with substrate 605. For example, deep via opening 606 may have a depth:diameter aspect ratio of 3:1, 5:1, or even 10:1 or more. As shown in FIG. 6B, in some exemplary embodiments, gate electrode 173 and gate dielectric 145 are already present at the time of patterning deep via opening 606. In some alternative embodiments, deep via opening 606 is patterned prior to a sacrificial gate replacement process.

Along the plane shown in FIG. 6C, deep via opening 606 is etched to have a lateral dimension of $CD_3$ equal to the spacing between adjacent stripes of dielectric spacer 171. Here too, a compositional difference between dielectric spacer 171 and isolation dielectric 180 may be leveraged to self-align deep via opening 606 within the gap between adjacent stripes of dielectric spacer 171. For example, an etch suitable for silicon dioxide employed as isolation dielectric 180 may be sufficiently selective to a silicon nitride and/or oxynitride employed as dielectric spacer 171 to confine deep via opening 606 to the lateral dimension of $CD_3$. Consistent with FIG. 6A, the plane shown in FIG. 6D further illustrates various transistor structures that may be present during the etching deep via opening 606.

FIGS. 7A, 7B, 7C, and 7D illustrate cross-sectional views of FET 101 after forming a deep via liner landing on a bottom of deep via opening 606, in accordance with some embodiments of operation 515 (FIG. 5A). In some exemplary embodiments, dielectric liner 190 is material (e.g., a silicon nitride, oxynitride or a low-k material) deposited conformally, for example by chemical vapor deposition (CVD) or atomic layer deposition (ALD). In some embodiments where dielectric liner 190 has a different composition than isolation dielectric 180, liner 190 is overetched for a predetermined time to recess liner 190 from a top surface of isolation dielectric 180 by height $H_1$ in preparation for interconnecting the deep via with source/drain metallization.

As shown in FIGS. 7A and 7C, dielectric liner 190 is anisotropically etched to clear the liner on surfaces normal to the etch ion flux (e.g., bottom of via opening 606) while retaining the liner on surfaces non-normal to the etch ion flux. A "spacer" of a desired longitudinal length is thereby formed on the sidewall of deep via opening 606. The liner etch process may be any known to be capable of forming self-aligned "spacers" of the liner material on sidewalls of topography. In alternate embodiments where deep via metallization is to be electrically isolated from source/drain metallization, liner 190 need not be recess etched. Following the liner etch, liner 190 is absent from a front-side surface of gate electrode 173 and isolation dielectric 180 (FIGS. 7B, and 7D). The deep via opening is then ready to be backfilled with a conductive material, such as metal. In some embodiments, contact metallization is deposited into the deep via opening and over source/drain semiconductor to concurrently metallize the source/drain terminals and the deep via. In alternative embodiments, the deep via opening is first backfilled with conductive material and then contact metal is formed over source/drain semiconductor.

FIGS. 8A, 8B, 8C, and 8D illustrate cross-sectional views of FET 101 after a deep via opening is filled with source/drain metallization 150, in accordance with some embodiments of operation 520 (FIG. 5A). As shown in FIG. 8A, source/drain metallization 150 further functions as deep via metallization 195, having been deposited directly on both semiconductor source/drain 140 and back-side substrate 605. In some embodiments, to form source/drain metallization 150, a contact metal trench is etched into isolation dielectric 180. The contact metal trench may be self-aligned to overlap the deep via opening by etching isolation dielectric 180 selectively to dielectric spacer 171. In practice, either the contact metal trench or the deep via may be patterned first. In some embodiments, etching the contact metal trench is the etch process that recesses liner 190. In alternative embodiments, the contact metal trench etch is selective to a liner that has been recessed in a prior operation. As shown in FIG. 8A, source/drain metallization 150 may be deposited into the contact metal trench that exposes one or more source/drain semiconductor 140. The metallization is deposited over liner 190, backfilling the deep via. Any deposition process known to be suitable for the particular source/drain (contact) material may be employed to backfill the deep via opening and the source/drain contact trench, such as, but not limited to, physical vapor deposition (PVD), metal ion plasma (MIP), electrolytic plating, and electroless plating. The front-side surface of source/drain metallization 150, gate electrode 173, and isolation dielectric may then be planarized with isolation dielectric 180 (e.g., by chemical-mechanical polish).

Following metallization of the deep via and source/drain terminals, front-end processing of transistor cell 101 is substantially complete. Any conventional backend interconnect fabrication may then be practiced to complete a front-side of the IC strata. In some further embodiments, a front-side stack (e.g., 205 in FIG. 2A) including any carrier may be applied over the front-side interconnect level(s). Back-side substrate 605 may then be removed or thinned sufficiently to expose deep via metallization 195. Additional back-side processing may be further performed according to known techniques, for example interconnecting deep via metallization 195 to a back-side interconnect level (e.g., 207 in FIG. 2A) coupling the deep via to various IC nodes such as power rails, signal busses, or the like.

In some embodiments, a deep via dielectric liner is deposited over a sacrificial material that partially backfills the deep via. After formation of the dielectric liner, the sacrificial material may be removed and replaced with one or more metals. Following deep via patterning, the transistor is substantially as illustrated in FIG. 6A-6D. The patterned deep via opening 606 is then filled with sacrificial material. FIGS. 9A, 9B, 9C, and 9D illustrate cross-sectional views of FET 101 after a deep via opening is backfilled with a sacrificial material 910, in accordance with some embodiments. Sacrificial material 910 may be any material that can be subsequently removed selectively to the permanent transistor structures. In exemplary embodiments, the sacrificial material is a dielectric, such as, but not limited to, carbonaceous materials (e.g., diamond-like carbon), spin-on glass (e.g., methylsilsesquioxane, hydrogensilsesquioxane), or flowable oxide. One or more of spin-on, CVD, and CMP may be employed to backfill the deep via opening and planarize sacrificial material 910 with a front-side surface of isolation dielectric 180.

Figures 10A, 10B:
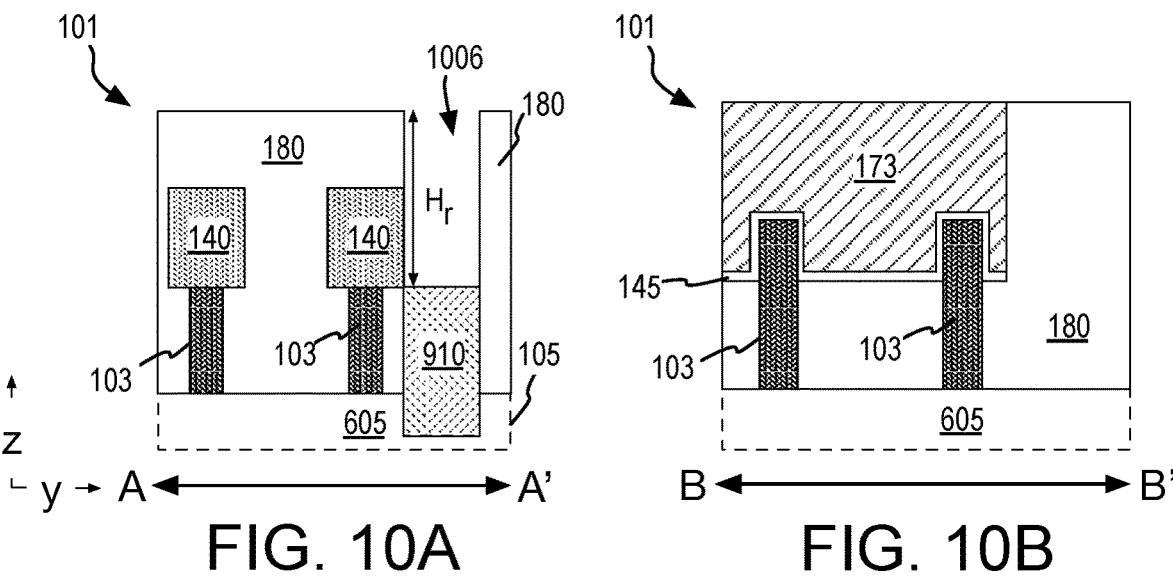
FIGS. 10A, 10B, 10C, and 10D illustrate cross-sectional views of a FET after the sacrificial material disposed in a deep via opening is recessed, in accordance with some embodiments.
Figures 10C, 10D:
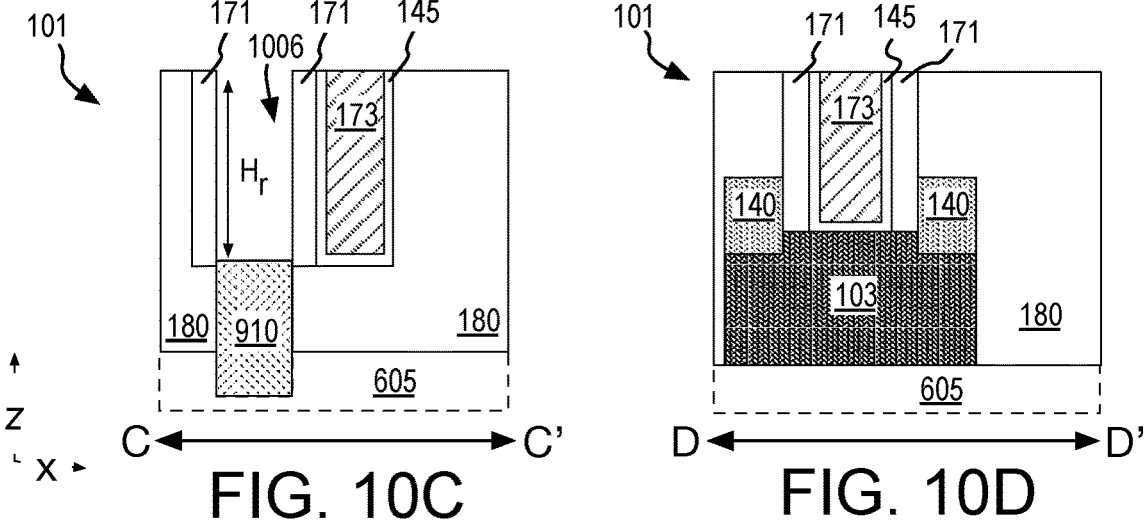

In some embodiments, sacrificial material within the deep via is recessed to expose a dielectric spacer sidewall of the deep via. In further embodiments, recessing of the sacrificial material further exposes source/drain semiconductor on a sidewall of the deep via. FIGS. 10A, 10B, 10C, and 10D illustrate cross-sectional views of FET 101 after the sacrificial material 910 is recessed by a height $H_r$, in accordance with some embodiments. Sacrificial material 910 may be recessed with any etchback process known to be suitable for the material. In advantageous embodiments, the recess etch isotropically removes the sacrificial material with high selectivity to all other materials exposed to the etch process. In some embodiments, where the sacrificial material is carbonaceous, the recess etch entails an oxygen or hydrogen based plasma etch process. As shown, recessing sacrificial material 910 reopens a top deep via portion 1006. As shown in FIG. 10C, the recess etch may be stopped after a predetermined time sufficient to recess sacrificial material 910 by height $H_r$, which fully exposes dielectric spacers 171 along the deep via sidewall. As further illustrated in FIG. 10A, the recess etch also exposes source/drain semiconductor 140 on the deep via sidewall.

In some embodiments, a deep via dielectric liner is formed over a sacrificial material disposed in a deep via. FIGS. 11A, 11B, 11C, and 11D illustrate cross-sectional views of FET 101 after deep via dielectric liner 190 is formed over sacrificial material 910, in accordance with some embodiments. As described elsewhere herein, dielectric liner 190 may be a material (e.g., a silicon nitride, oxynitride or a low-k material) that is deposited conformally, for example by CVD or ALD. In some embodiments where dielectric liner 190 has a different composition than isolation dielectric 180, liner 190 is overetched for a predetermined time to recess liner 190 from a top surface of isolation dielectric 180 by height $H_1$. As shown in FIGS. 11A and 11C, dielectric liner 190 is anisotropically etched to erode liner material on surfaces normal to the etch ion flux (e.g., exposing sacrificial material 910) while retaining the liner on surfaces non-normal to the etch ion flux. The liner etch process may be any known to be capable of forming self-aligned "spacers" of the liner material on sidewalls of topography. Following the liner etch, liner 190 is absent from a top surface of gate electrode 173 and isolation dielectric 180 (FIGS. 11B, and 11D). The liner etch process may be selective to sacrificial material 910, or sacrificial material 910 may also be significantly eroded by the liner etch process.

In some embodiments, sacrificial material disposed in a deep via is removed and replaced with conductive material.

FIGS. 12A, 12B, 12C, and 12D illustrate cross-sectional views of FET 101 after sacrificial material 910 is removed from deep via opening 606, in accordance with some embodiments. As illustrated in FIGS. 12A and 12C, sacrificial material is removed selectively to isolation dielectric 180 and deep via dielectric liner 190, reopening deep via opening 606 after the additional sidewall dielectric liner material has supplemented dielectric spacer 171. Removal of the sacrificial material may be by any process known to be suitable for the material that provides sufficient selectivity. In some embodiments, where the sacrificial material is carbonaceous, sacrificial material 910 may be removed with an oxygen or hydrogen-based plasma etch process. The deep via opening is then ready to be backfilled with a conductive material, such as a metal. In some embodiments, contact metallization is deposited into the deep via opening and over source/drain semiconductor to concurrently metallize the source/drain terminals and the deep via. In alternative embodiments, the deep via opening is first backfilled with conductive material and then contact metal is deposited over source/drain semiconductor.

FIGS. 13A, 13B, 13C, and 13D illustrate cross-sectional views of FET 101 after a deep via opening is filled with source/drain metallization 150, in accordance with some embodiments of operation 520 (FIG. 5A). As shown in FIG. 13A, source/drain metallization 150 further functions as deep via metallization 195, having been deposited directly on both semiconductor source/drain 140 and back-side substrate 605. In some embodiments, to form source/drain metallization 150, a contact metal trench is etched into isolation dielectric 180. The contact metal trench may be self-aligned to overlap the deep via opening by etching isolation dielectric 180 selectively to dielectric spacer 171. In some embodiments, etching the contact metal trench also recesses liner 190. In alternative embodiments, the contact metal trench etch is selective to a liner that has been recessed in a prior operation. As shown in FIG. 13A, source/drain metallization 150 may be deposited into the contact metal trench that exposes one or more source/drain semiconductor 140. The metallization is further deposited over liner 190, backfilling the deep via. Any deposition process known to be suitable for the particular source/drain (contact) material may be employed to backfill the deep via opening and the source/drain contact trench, such as, but not limited to, PVD, MIP, electrolytic plating, and electroless plating. The front-side surface of source/drain metallization 150, gate electrode 173, and isolation dielectric may then be planarized with isolation dielectric 180 (e.g., by chemical-mechanical polish).

Following metallization of the deep via and source/drain terminals, front-end processing of transistor cell 101 is substantially complete. Any conventional backend interconnect fabrication may then be practiced to complete a front side of the IC. In some further embodiments, a front-side stack (e.g., 205 in FIG. 2A) including any carrier may be applied to a front side of the IC strata, and back-side substrate 605 then removed or thinned sufficiently to expose deep via metallization 195. Additional back-side processing may be further performed according to known techniques, for example interconnecting deep via metallization 195 to a back-side interconnect level (e.g., 207 in FIG. 2A) coupling the deep via to various IC nodes such as power rails, signal busses, or the like.

In some other embodiments, methods of forming a deep via dielectric liner entail selective liner formation where the dielectric liner is formed on certain sidewall materials selectively to other materials present at the deep via sidewall. Following deep via patterning, the transistor is substantially as illustrated in FIG. 6A-6D. FIGS. 14A, 14B, 14C, and 14D illustrate cross-sectional views of FET 101 after dielectric liner 190 is selectively formed on a portion of deep via opening 606, in accordance with some embodiments. As shown in FIGS. 14A and 14C, dielectric liner 190 is formed on portions of the deep via sidewall where dielectric spacer 171 is exposed, but is not formed on portions of the deep via sidewall where isolation dielectric 180 is exposed. As illustrated by dashed line in FIG. 14A, dielectric liner 190 may also be selectively formed on portions of the deep via sidewall where source/drain semiconductor 140 is exposed.

In some advantageous embodiments, selective liner formation entails a selective deposition that favors material deposition on dielectric spacer 171 over deposition on isolation dielectric 180. Such a deposition process may directly form the deep via dielectric liner, or may form a precursor or catalyst from which the deep via dielectric liner is then formed. In one example where dielectric spacer 171 is a silicon nitride and isolation dielectric 180 is a silicon dioxide, silicon may be deposited on the silicon nitride selectively to the silicon dioxide using one or more selective deposition techniques known in the art. Following selective deposition, a short isotropic silicon etch may be performed to ensure no silicon is deposited on any surface but the silicon nitride spacer. Subsequently, the deposited silicon film may be converted to the dielectric liner, for example through its oxidation (either plasma or thermal) to form a silicon dioxide liner 190, its nitridation (either plasma or thermal) to form a silicon nitride liner, or a combination thereof to form an oxynitride liner.

The deep via opening is then ready to be backfilled with a conductive material, such as a metal. In some embodiments, contact metallization is deposited into the deep via opening and over source/drain semiconductor to concurrently metallize the source/drain terminals and the deep via. Notably, if no dielectric liner forms on sidewalls where isolation dielectric is exposed, there may be no need to recess etch selectively formed dielectric liner prior to currently depositing source/drain metallization and deep via metallization. In alternative embodiments, the deep via opening is first backfilled with conductive material and then contact metal is deposited over source/drain semiconductor.

FIGS. 15A, 15B, 15C, and 15D illustrate cross-sectional views of FET 101 after a deep via opening is filled with source/drain metallization 150, in accordance with some embodiments of operation 520 (FIG. 5A). As shown in FIG. 15A, source/drain metallization 150 further functions as deep via metallization 195, having been deposited directly on both semiconductor source/drain 140 and back-side substrate 605. In some embodiments, to form source/drain metallization 150, a contact metal trench is etched into isolation dielectric 180. The contact metal trench may be self-aligned to overlap the deep via opening by etching isolation dielectric 180 selectively to dielectric spacer 171 and liner 190. As shown in FIG. 15A, source/drain metallization 150 may be deposited into the contact metal trench that exposes one or more source/drain semiconductor 140. The metallization is further deposited over liner 190, backfilling the deep via. Any deposition process known to be suitable for the particular source/drain (contact) material may be employed to backfill the deep via opening and the source/drain contact trench, such as, but not limited to, PVD, MIP, electrolytic plating, and electroless plating. The top surface of source/drain metallization 150, gate electrode 173, and isolation dielectric may then be planarized (e.g., by chemical-mechanical polish).

Figure 16:
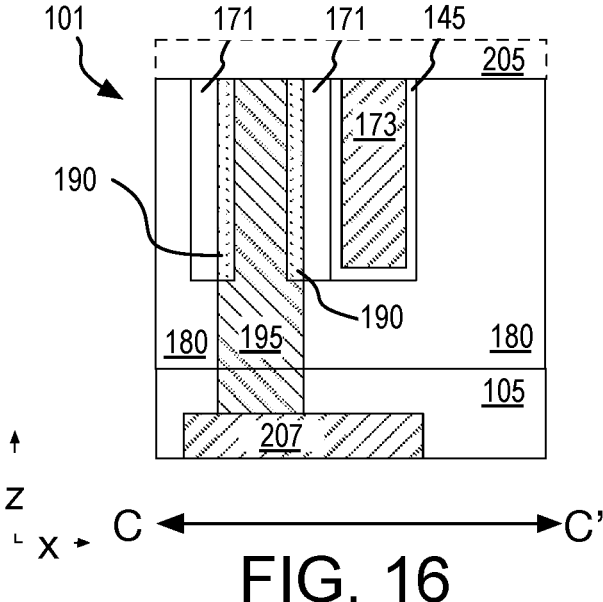
FIG. 16 illustrates a cross-sectional view of a FET after a deep via is interconnected with a back-side stack including a back-side interconnect metal level, in accordance with some embodiments.

Following metallization of the deep via and source/drain terminals, front-end processing of transistor cell 101 is substantially complete. Any conventional backend interconnect fabrication may then be practiced to complete a front-side of the IC. In some further embodiments illustrated in FIG. 16, front-side stack 205 including any carrier may be applied to a front side of cell 101. Back-side substrate 605 may then be removed or thinned sufficiently to expose deep via metallization 195. Additional back-side processing may be further performed according to known techniques, for example interconnecting deep via metallization 195 to back-side interconnect level 207 that electrically couples the deep via to various IC nodes such as power rails, signal busses, or the like.

Figure 17:
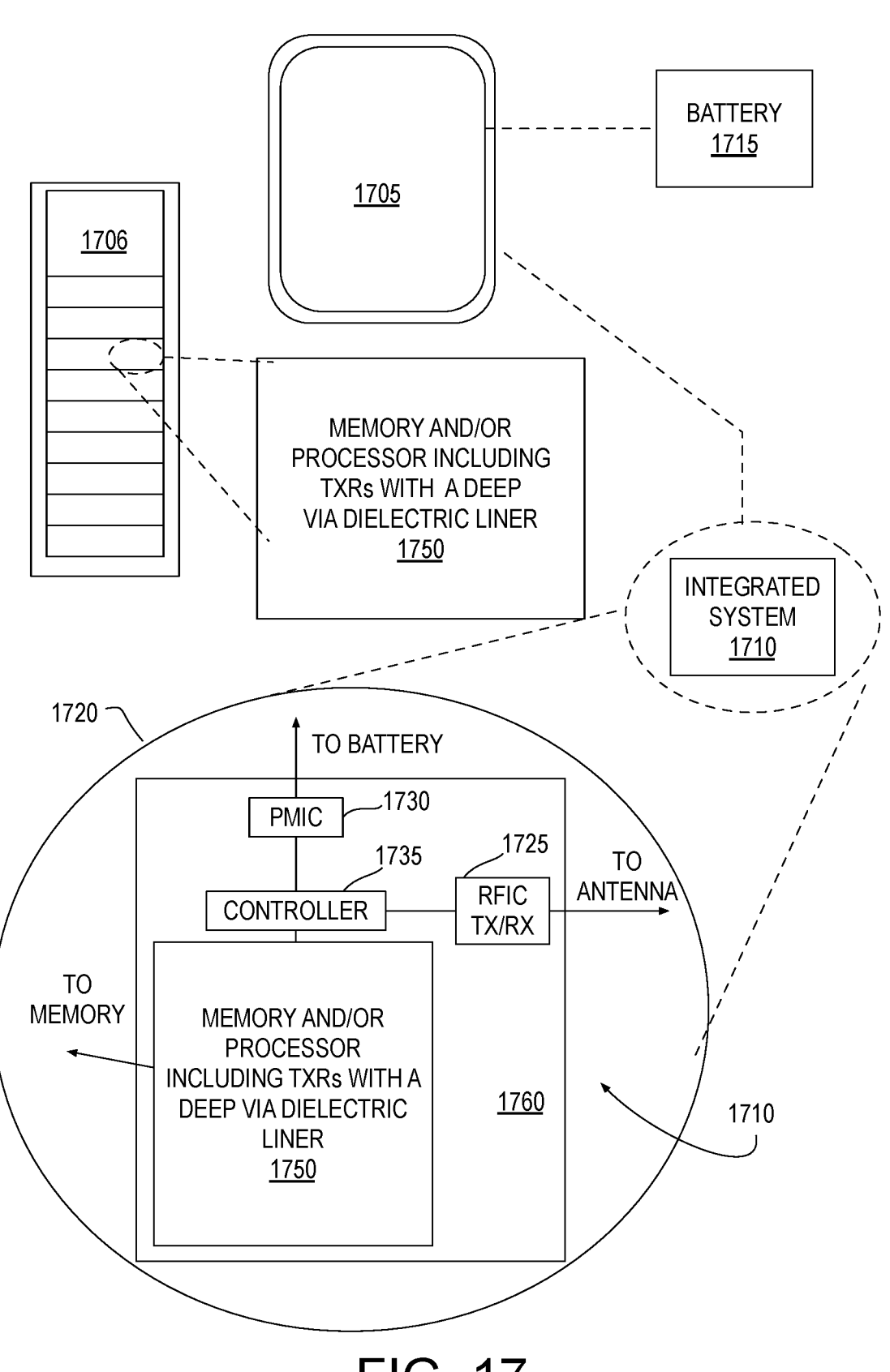
FIG. 17 illustrates a mobile computing platform and a data server machine employing an SoC having a plurality of FETs including a deep source/drain via dielectric liner, in accordance with embodiments.

FIG. 17 illustrates a mobile computing platform and a data server machine employing an SoC including FETs with a deep via dielectric liner, for example as described elsewhere herein. The server machine 1706 may be any commercial server, for example including any number of high-performance computing platforms disposed within a rack and networked together for electronic data processing, which in the exemplary embodiment includes a packaged monolithic SoC 1750. The mobile computing platform 1705 may be any portable device configured for each of electronic data display, electronic data processing, wireless electronic data transmission, or the like. For example, the mobile computing platform 1705 may be any of a tablet, a smart phone, laptop computer, etc., and may include a display screen (e.g., a capacitive, inductive, resistive, or optical touchscreen), a chip-level or package-level integrated system 1710, and a battery 1715.

Either disposed within the integrated system 1710 illustrated in the expanded view 1720, or as a stand-alone packaged chip within the server machine 1706, monolithic SoC 1750 includes a memory block (e.g., RAM), a processor block (e.g., a microprocessor, a multi-core microprocessor, graphics processor, or the like) including at least one FET including a dielectric-lined source/drain deep via, for example as described elsewhere herein. The monolithic SoC 1750 may be further coupled to a board, a substrate, or an interposer 1760 along with, one or more of a power management integrated circuit (PMIC) 1730, RF (wireless) integrated circuit (RFIC) 1725 including a wideband RF (wireless) transmitter and/or receiver (TX/RX) (e.g., including a digital baseband and an analog front end module further comprises a power amplifier on a transmit path and a low noise amplifier on a receive path), and a controller 1735.

Functionally, PMIC 1730 may perform battery power regulation, DC-to-DC conversion, etc., and so has an input coupled to battery 1715 and with an output providing a current supply to other functional modules. As further illustrated, in the exemplary embodiment, RFIC 1725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 1750.

Figure 18:
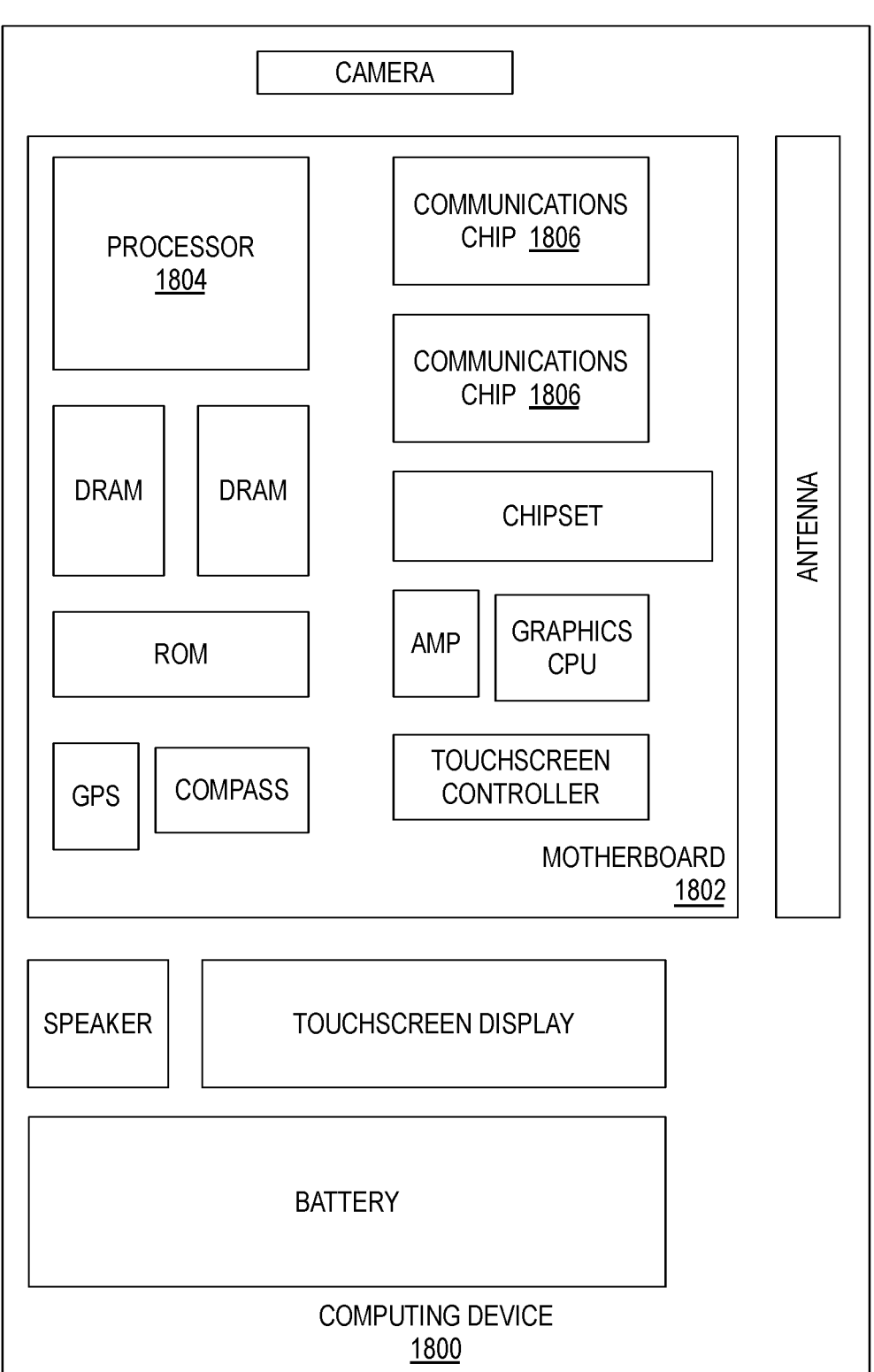
FIG. 18 is a functional block diagram of an electronic computing device, in accordance with some embodiments.

FIG. 18 is a functional block diagram of an electronic computing device, in accordance with some embodiments. Computing device 1800 may be found inside platform 1805 or server machine 1806, for example. Device 1800 further includes a motherboard 1802 hosting a number of components, such as, but not limited to, a processor 1804 (e.g., an applications processor), which may further incorporate at least one FET with a deep via dielectric liner, for example as described elsewhere herein. Processor 1804 may be physically and/or electrically coupled to motherboard 1802. In some examples, processor 1804 includes an integrated circuit die packaged within the processor 1804. In general, the term "processor" or "microprocessor" may refer to any device or portion of a device that processes electronic data from registers and/or memory to transform that electronic data into other electronic data that may be further stored in registers and/or memory.

In various examples, one or more communication chips 1806 may also be physically and/or electrically coupled to the motherboard 1802. In further implementations, communication chips 1806 may be part of processor 1804. Depending on its applications, computing device 1800 may include other components that may or may not be physically and electrically coupled to motherboard 1802. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1806 may enable wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1806 may implement any of a number of wireless standards or protocols, including but not limited to those described elsewhere herein. As discussed, computing device 1800 may include a plurality of communication chips 1806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first embodiments, a transistor cell having a front-side and a back-side, comprises a transistor and a deep via. The transistor further includes a source semiconductor and a drain semiconductor separated by a channel semiconductor, a gate electrode stack including a gate electrode and a gate dielectric disposed over the channel semiconductor, and source/drain metallization in contact with the source and drain semiconductor and separated from the gate electrode by at least a first dielectric spacer. The deep via extends between the front-side and back-side of the cell, and includes via metallization separated from the gate electrode by at least the first dielectric spacer and a dielectric via liner disposed on at least a portion of a sidewall of the deep via.

In furtherance of the first embodiments, the via metallization makes direct contact with a metallization level on the front-side and direct contact with a metallization level disposed on the back-side, and the dielectric via liner is in contact with the first dielectric spacer.

In furtherance of the first embodiments immediately above, the dielectric via liner is in contact with at least one of the source semiconductor and drain semiconductor.

In furtherance of the first embodiments immediately above, the via metallization is in contact with the source/drain metallization that is contact with one of the source semiconductor and drain semiconductor.

In furtherance of the first embodiments immediately above, the via metallization has the same composition as the source/drain metallization.

In furtherance of the first embodiments above, the dielectric via liner extends over less than the entire longitudinal length of the deep via.

In furtherance of the first embodiments immediately above, the dielectric via liner is in contact with the backside metallization level.

In furtherance of the first embodiments, the transistor cell further comprises a second dielectric spacer in contact with a sidewall of the source/drain metallization opposite the first dielectric spacer, and the dielectric via liner is in contact with the first dielectric spacer and second dielectric spacer.

In furtherance of the first embodiments, the semiconductor channel is a top portion of a semiconductor fin embedded in an isolation dielectric, and the deep via metallization is separated from the semiconductor fin by at least the isolation dielectric.

In furtherance of the first embodiments immediately above, the deep via is separated from the isolation dielectric by the dielectric via liner.

In furtherance of the first embodiments above, the deep via is in contact with the isolation dielectric.

In furtherance of the first embodiments, the deep via metallization has a diameter at a top and bottom of the deep via that exceeds a diameter of via metallization adjacent to the dielectric via liner.

In furtherance of the first embodiments immediately above, the diameter of the via metallization at the top of the deep via is equal to a spacing between the first spacer dielectric and a second spacer dielectric in contact with a sidewall of the source/drain metallization opposite the first dielectric spacer.

In furtherance of the first embodiments immediately above, the via liner has a permittivity no more than that of the spacer dielectric, and the via liner has a thickness no greater than that of the spacer dielectric.

In one or more second embodiments, an integrated circuit (IC) comprises one or more transistor strata including a field effect transistor (FET), and a deep via extending through a thickness of the strata at least equal to a thickness of a semiconductor body of the FET, wherein the deep via comprises a dielectric liner and metallization, the deep via metallization separated from the FET by at least the dielectric liner.

In furtherance of the second embodiments immediately above, the semiconductor body comprises a channel semiconductor. The FET comprises a gate electrode stack including a gate electrode and a gate dielectric disposed over the channel semiconductor, a source semiconductor and a drain semiconductor separated by the channel semiconductor; and source/drain metallization in contact with the source and drain semiconductor and separated from the gate electrode by at least a first dielectric spacer. The deep via metallization is separated from the gate electrode by at least the first dielectric spacer and the dielectric liner disposed on at least a portion of a sidewall of the deep via adjacent to the first dielectric spacer.

In furtherance of the second embodiments immediately above, the dielectric liner is in contact with the first dielectric spacer, the dielectric liner is in contact with at least one of the source semiconductor and drain semiconductor, and the deep via metallization is in contact with the source/drain metallization that is contact with one of the source semiconductor and drain semiconductor.

In one or more third embodiments, a method of fabricating a field effect transistor (FET) cell comprises forming source semiconductor and a drain semiconductor separated by a channel semiconductor surrounded by an isolation dielectric. The method comprises forming a gate stack over the channel semiconductor, the gate stack including a gate electrode and a gate dielectric. The method comprises forming source/drain metallization in contact with the source and drain semiconductor and separated from the gate electrode by at least a first dielectric spacer. The method comprises forming a deep via opening in the isolation dielectric that exposes the first dielectric spacer at a sidewall of the via. The method comprises forming a dielectric liner within the deep via opening that covers at least the first dielectric spacer. The method comprises depositing a conductive material within the deep via opening to interconnect a first end of the deep via metallization with the source/drain metallization. The method comprises forming a back-side interconnect metallization level in contact with a second end of the deep via metallization, opposite the first end.

In furtherance of the third embodiments, forming the dielectric liner further comprises depositing a dielectric material on sidewalls of the via opening, and recessing the dielectric material to a height below a top of the via opening.

In furtherance of the third embodiments, forming the dielectric liner further comprises depositing a material on the first dielectric spacer selectively to the isolation dielectric.

In furtherance of the third embodiments immediately above, depositing the material on the first dielectric spacer further comprises depositing a silicon layer on the first dielectric spacer, and the method further comprises converting the silicon layer into a dielectric through oxidation or nitridation.

In furtherance of the third embodiments immediately above, forming the dielectric liner further comprises backfilling a bottom portion of the via opening with a sacrificial material, depositing a dielectric material over the sacrificial material and on sidewalls of a top portion of the via opening not filled with the sacrificial material, anisotropically etching the dielectric material to expose the sacrificial material, and removing the sacrificial material.

In furtherance of the third embodiments, forming the forming the back-side interconnect metallization level further comprises removing or thinning a first substrate to expose the second via metallization end, and depositing the back-side interconnect metallization level in contact with the second via metallization end.

In furtherance of the third embodiments, depositing the conductive material with the deep via opening further comprises depositing one or more metals in the deep via and on at least one of the source semiconductor and a drain semiconductor concurrently, the metals interconnecting the source or drain semiconductor with the deep via.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method of fabricating a transistor structure, the method comprising:
forming a source and a drain separated by a channel;
forming a gate electrode over the channel, wherein the source and drain are separated from the gate electrode by at least a spacer comprising a dielectric material;
forming a via opening that exposes the spacer along a sidewall of the via opening;
forming a liner within the via opening and in direct contact with the spacer, wherein the liner comprises a dielectric material;
depositing a conductive material within the via opening to interconnect a first end of a via metallization with the source or drain; and
forming a back-side metallization in contact with a second end of the via metallization, opposite the first end.

2. The method of claim 1, wherein forming the liner further comprises:
depositing a dielectric material on a sidewall of the via opening; and
recessing the dielectric material to a height below a top of the via opening.

3. The method of claim 2, further comprising forming an isolation dielectric and wherein forming the via opening comprises etching through at least a partial thickness of the isolation dielectric.

4. The method of claim 3, wherein the liner within the via opening covers at least the spacer.

5. The method of claim 4, wherein forming the liner further comprises depositing a material on the spacer selectively to the isolation dielectric.

6. The method of claim 5, wherein depositing the material on the spacer selectively further comprises depositing a silicon layer on the spacer; and
the method further comprises converting the silicon layer into a dielectric through oxidation or nitridation.

7. The method of claim 5, wherein forming the liner further comprises:
backfilling a bottom portion of the via opening with a sacrificial material;
depositing a dielectric material over the sacrificial material and on a sidewall of a top portion of the via opening left unfilled by the sacrificial material;

anisotropically etching the dielectric material to expose the sacrificial material; and
removing the sacrificial material.

8. The method of claim 4, wherein the liner has a relative permittivity no more than that of the spacer.

9. The method of claim 1, wherein forming the back-side metallization further comprises:
removing or thinning a substrate material to expose the second end of the via metallization; and
depositing the back-side metallization in contact with the second end of the via metallization.

10. The method of claim 1, wherein depositing the conductive material with the via opening further comprises depositing one or more metals in the via opening and in contact with at least one of the source or drain.

11. The method of claim 1, further comprising forming source metallization and drain metallization in contact with the source and drain, and wherein depositing the conductive material within the via opening comprises depositing one or more metals in the via opening and in contact with at least one of the source metallization or drain metallization.

12. A method of fabricating an integrated circuit (IC) structure, the method comprising:
forming one or more device strata including a field effect transistor (FET) comprising a semiconductor material body, wherein:
the semiconductor material body comprises a channel material and the FET comprises:
a source semiconductor and a drain semiconductor separated by the channel material; and
a gate electrode adjacent to the channel material and separated from the source semiconductor and the drain semiconductor by a dielectric spacer;
forming a via opening through a thickness of the device strata that is at least equal to a thickness of the semiconductor material body, the via opening exposing the dielectric spacer;
forming a dielectric liner along a sidewall of the via opening, and in direct contact with the dielectric spacer; and
forming via metallization within the via opening, the via metallization separated from the gate electrode by at least the dielectric liner and the dielectric spacer.

13. The method of claim 12, further comprising forming a back-side metallization in contact with the via metallization.

14. The method of claim 13, wherein forming the back-side metallization further comprises:
removing or thinning a substrate material to expose the via metallization; and
depositing the back-side metallization in contact with the via metallization.

15. The method of claim 12, wherein the dielectric liner has a relative permittivity no more than that of the dielectric spacer.

16. A method of fabricating a field effect transistor (FET) structure, the method comprising:
forming a source and a drain separated by a channel adjacent to an isolation dielectric;
forming a gate stack over the channel, the gate stack including a gate electrode and a gate dielectric;
forming source and drain metallization in contact with corresponding ones of the source and drain, and separated from the gate electrode by at least a spacer comprising a dielectric;
forming a via opening in the isolation dielectric that exposes the spacer at a sidewall of the via opening;

forming a liner within the via opening that is in direct contact with the spacer, wherein the liner comprises a dielectric;

depositing a conductive material with the via opening to interconnect a first end of a via metallization with the source or drain; and forming a back-side metallization in contact with a second end of the via metallization, opposite the first end.

17. The method of claim 16, wherein forming the liner further comprises depositing a material on the spacer selectively to the isolation dielectric.

18. The method of claim 16, wherein forming the back-side metallization further comprises:

removing or thinning a substrate material to expose the via metallization; and depositing the back-side metallization in contact with the via metallization.

19. The method of claim 16, wherein forming the liner further comprises:

backfilling a bottom portion of the via opening with a sacrificial material;

depositing a dielectric material over the sacrificial material and on a sidewall of a top portion of the via opening left unfilled by the sacrificial material;

anisotropically etching the dielectric material to expose the sacrificial material; and removing the sacrificial material.

\* \* \* \* \*